(12) United States Patent
Sugai et al.

(10) Patent No.: US 10,199,460 B2
(45) Date of Patent: Feb. 5, 2019

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventors: Isamu Sugai, Matsumoto (JP); Takeyoshi Nishimura, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 52 days.

(21) Appl. No.: 15/665,920

(22) Filed: Aug. 1, 2017

(65) Prior Publication Data

US 2018/0069115 A1   Mar. 8, 2018

(30) Foreign Application Priority Data

Sep. 8, 2016 (JP) ................................. 2016-175316

(51) Int. Cl.
*H01L 29/06* (2006.01)
*H01L 21/265* (2006.01)
(Continued)

(52) U.S. Cl.
CPC .... *H01L 29/0634* (2013.01); *H01L 21/26513* (2013.01); *H01L 29/0688* (2013.01); *H01L 29/0696* (2013.01); *H01L 29/66734* (2013.01); *H01L 29/7811* (2013.01); *H01L 29/7813* (2013.01); *H01L 21/02532* (2013.01); *H01L 29/36* (2013.01); *H01L 29/4236* (2013.01)

(58) Field of Classification Search
None
See application file for complete search history.

(56) References Cited

U.S. PATENT DOCUMENTS 6,097,063 A * 8/2000 Fujihira .............. H01L 29/0619
257/139
7,002,205 B2 * 2/2006 Onishi ................ H01L 29/0634
257/328

(Continued)

FOREIGN PATENT DOCUMENTS

JP    2003-224273 A    8/2003
JP    2004-134597 A    4/2004
(Continued)

*Primary Examiner* — Eduardo A Rodela
*Assistant Examiner* — Nilufa Rahim
(74) *Attorney, Agent, or Firm* — Rabin & Berdo, P.C.

(57) ABSTRACT

An n-type region and a p-type region of a first parallel pn layer are arranged parallel to a base front surface, in a striped planar layout extending from an active region over an edge termination region. In the n-type region, a gate trench extending linearly along a first direction is provided. In an intermediate region, in a surface region on the base front surface side of the first parallel pn layer, a second parallel pn layer is provided. The second parallel pn layer is arranged having a repetition cycle shifted along a second direction ½ a cell with respect to a repetition cycle of the n-type region and the p-type region of the first parallel pn layer. A gate trench termination portion terminates in the intermediate region between the active region and the edge termination region, and is covered by the p-type region of the second parallel pn layer.

13 Claims, 16 Drawing Sheets

(51) Int. Cl.
    *H01L 29/66*       (2006.01)
    *H01L 29/78*       (2006.01)
    *H01L 21/02*       (2006.01)
    *H01L 29/36*       (2006.01)
    *H01L 29/423*     (2006.01)

(56) References Cited

U.S. PATENT DOCUMENTS

| | | | |
|---|---|---|---|
| 7,973,362 B2 * | 7/2011 | Willmeroth | H01L 29/0634 |
| | | | 257/329 |
| 8,786,015 B2 * | 7/2014 | Tamura | H01L 29/7815 |
| | | | 257/339 |
| 9,437,727 B2 * | 9/2016 | Onishi | H01L 29/063 |
| 2002/0167020 A1 * | 11/2002 | Iwamoto | H01L 29/7802 |
| | | | 257/110 |
| 2003/0176031 A1 | 9/2003 | Onishi et al. | |
| 2004/0135228 A1 | 7/2004 | Iwamoto et al. | |
| 2005/0035371 A1 * | 2/2005 | Fujihira | H01L 29/0619 |
| | | | 257/200 |
| 2007/0007589 A1 | 1/2007 | Nakagawa | |
| 2010/0230715 A1 * | 9/2010 | Mauder | H01L 29/0634 |
| | | | 257/139 |
| 2014/0035002 A1 * | 2/2014 | Cao | H01L 29/7827 |
| | | | 257/192 |
| 2015/0295028 A1 | 10/2015 | Kagata et al. | |

FOREIGN PATENT DOCUMENTS

| | | |
|---|---|---|
| JP | 2007-012977 A | 1/2007 |
| JP | 2014-132637 A | 7/2014 |

* cited by examiner

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2016-175316, filed on Sep. 8, 2016, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

A superjunction (SJ) semiconductor device having, as a drift layer, a parallel pn layer in which a p-type region and an n-type region having raised impurity concentrations are alternately arranged repeatedly along a direction (horizontal direction) parallel to a substrate main surface is conventionally known. Further, a technique of facilitating low ON resistance in a superjunction metal oxide semiconductor field effect transistor (SJ-MOSFET) by applying a trench gate structure that structurally obtains low ON resistance easily is known. A structure of a region (hereinafter, intermediate region) between an active region and an edge termination region of a trench-gate-type SJ-MOSFET of a related art will be described.

FIG. 13 is a plan view of a planar layout of a portion of a MOS gate of a trench-gate-type SJ-MOSFET of the related art. A planar layout is a planar state and arrangement configuration of parts as viewed from a front surface side of a semiconductor base (semiconductor chip) 110. An active region 121 is a region in which current flows during an ON state. An edge termination region 122 is a region that surrounds a periphery of the active region 121 and sustains the breakdown voltage by mitigating the electric field of a chip front surface side of the active region 121. Breakdown voltage is the voltage limit at which element destruction does not occur. FIG. 14 is a cross-sectional view along a cutting line AA-AA' in FIG. 13. FIG. 15 is a cross-sectional view along a cutting line BB-BB' in FIG. 13.

As depicted in FIG. 13, an n-type region 103 and a p-type region 104 of a parallel pn layer 105 are arranged along a direction parallel to a base main surface, in a planar layout having a striped shape extending from the active region 121 over the edge termination region 122. In a trench (hereinafter, gate trench) 106, a MOS gate (hereinafter, trench gate) 109 is embedded. The gate trench 106 is arranged in a planar layout having a striped shape parallel to a direction (hereinafter, a second direction) X along which the n-type region 103 and the p-type region 104 of the parallel pn layer 105 extend. The gate trench 106 extends from the active region 121 to an outer side (chip end portion side) and an end portion of the gate trench 106 (hereinafter, gate trench termination portion) 106a terminates in an intermediate region 123 of the active region 121 and the edge termination region 122.

Further, in the active region 121, the gate trench 106 is arranged in the n-type region 103 of the parallel pn layer 105. The reason for this is as follows. In the gate trench 106, a gate electrode 108 is embedded on a gate insulating film 107 (not depicted in FIG. 13, refer to FIGS. 14 and 15), forming the trench gate 109. In the active region 121, when the gate trench 106 is arranged in the p-type region 104 of the parallel pn layer 105, at a side wall of the gate trench 106, the trench gate 109 and the n-type region 103 of the parallel pn layer 105 do not face each other across the gate insulating film 107. In this case, in the ON state, a channel (n-type inversion layer) becoming a path of current flowing between a $n^+$-type source region 113 and the n-type region 103 of the parallel pn layer 105 is not formed in a p-type base region (not depicted) and therefore, the gate trench 106 is arranged in the n-type region 103 of the parallel pn layer 105.

In this manner, since the gate trench 106 is arranged in the n-type region 103 of the parallel pn layer 105, inevitably the gate trench termination portion 106a is also arranged in the n-type region 103 of the parallel pn layer 105. In the intermediate region 123, on a front surface 110a of a semiconductor base (semiconductor chip) 110, a MOS gate (hereinafter, planar gate) 111 is provided having a planar shape. In FIG. 13, the planar gate 111 is a region between two parallel dashed lines 111a. The planar gate 111 in a depth direction Z, faces and is in contact with the trench gate 109 at the gate trench termination portion (6a) 106a, which is an extended portion of the trench gate 109.

In other words, as depicted in FIGS. 14 and 15, the gate insulating film 107 and the gate electrode 108 constituting a MOS gate (the trench gate 109 and the planar gate 111) extend from inside the gate trench 106, onto the front surface 110a of the semiconductor base 110, in the intermediate region 123. Although a source electrode and drain electrode are not depicted, the source electrode is provided on the front surface 110a of the semiconductor base 110 and is in contact with the $n^+$-type source region 113 and a $p^+$-type contact region 114. The drain electrode is provided on a rear surface of the semiconductor base 110 (surface of $n^+$-type semiconductor substrate 101). Reference characters 102 and 112 are an $n^-$-type buffer layer and an interlayer insulating film, respectively.

As such a trench-gate-type SJ-MOSFET, a device having at a portion of the n-type region of the parallel pn layer corresponding to a bottom surface of the gate trench, an n-type diffusion region provided so as to cover the bottom surface of the gate trench has been proposed (for example, refer to Japanese Laid-Open Patent Publication No. 2007-012977 (paragraph 0013, FIG. 1)). In Japanese Laid-Open Patent Publication No. 2007-012977, even when a formation position of the gate trench is shifted, a channel and the n-type region of the parallel pn layer are connected via the n-type diffusion region covering the bottom surface of the gate trench, establishing a current path. Further, Japanese Laid-Open Patent Publication No. 2007-012977 discloses that when the gate trench is provided reaching the p-type region of the parallel pn layer, the width of the p-type region of the parallel pn layer is made narrower than the width of the gate trench.

As another trench-gate-type SJ-MOSFET, a device has been proposed in which the n-type region and the p-type region of the parallel pn layer and the gate trench are arranged in a planar layout having a striped shape extending along a same direction (direction parallel to the second direction X) (for example, refer to Japanese Laid-Open Patent Publication No. 2014-132637 (paragraphs 0068 to 0069, FIGS. 15 to 17), Japanese Laid-Open Patent Publication No. 2004-134597 (paragraph 0040, FIGS. 10 to 12)). In Japanese Laid-Open Patent Publication No. 2014-132637, configuration is such that the gate trench is arranged in the n-type region of the parallel pn layer and at the gate trench termination portion (6a), the p-type region is provided so as to surround the bottom of the gate trench. In Japanese Laid-Open Patent Publication No. 2004-134597, configuration is such that the gate trench is arranged in the p-type region of the parallel pn layer and the gate trench termination portion (6a) is surrounded by a wide-width portion of the p-type region of the parallel pn layer.

As another trench-gate-type SJ-MOSFET, a device has been proposed in which on the outer side of the active region, at a surface region (surface layer) on the substrate front surface side of the parallel pn layer continuous from the active region, another parallel pn layer having an impurity concentration lower than that of the parallel pn layer is provided (for example, refer to Japanese Laid-Open Patent Publication No. 2003-224273 (paragraphs 0027 to 0028, FIGS. 1 and 2)). In Japanese Laid-Open Patent Publication No. 2003-224273, on the n-type region and the p-type region of the parallel pn layer continuous from the active region, an $n^-$-type region and a $p^-$-type region are arranged in a same planar layout, respectively, whereby the other parallel pn layer having a lower impurity concentration than the parallel pn layer is formed.

SUMMARY OF THE INVENTION

According to one aspect of the present invention, a semiconductor device includes a first parallel pn layer having a first main surface and a second main surface, the first parallel pn layer having a first first-conductivity-type semiconductor region and a first second-conductivity-type semiconductor region alternately and repeatedly arranged along a direction parallel to the first main surface; a first semiconductor region of a second conductivity type arranged on the first main surface of the first parallel pn layer; a second parallel pn layer adjacent to the first semiconductor region on the first main surface of the first parallel pn layer, and having a second first-conductivity-type semiconductor region and a second second-conductivity-type semiconductor region alternately and repeatedly arranged along a direction parallel to the first main surface of the first parallel pn layer; a trench reaching a surface layer of the first first-conductivity-type semiconductor region from a surface of the first semiconductor region; a second semiconductor region of a first conductivity type selectively formed in a surface layer of the first semiconductor region, in contact with the trench; a gate electrode provided in the trench via a gate insulating film; a first electrode electrically connected to the first semiconductor region and the second semiconductor region; a semiconductor layer provided on the second main surface of the first parallel pn layer; and a second electrode electrically connected to the semiconductor layer. The trench extends to the second parallel pn layer and terminates in the second second-conductivity-type semiconductor region. The gate electrode extends outside from inside the trench and is further arranged on a surface of the second parallel pn layer via the gate insulating film. The second first-conductivity-type semiconductor region and the second second-conductivity-type semiconductor region are arranged having a repetition cycle shifted by a half with respect to a repetition cycle of the first first-conductivity-type semiconductor region and the first second-conductivity-type semiconductor region.

In the semiconductor device, the trench has a width of a short dimension direction narrower than a width of the second second-conductivity-type semiconductor region along a direction parallel to the short dimension direction.

In the semiconductor device, a depth of the trench from the surface of the first semiconductor region in a direction toward the second main surface is deeper than a thickness of the second second-conductivity-type semiconductor region.

In the semiconductor device, the first first-conductivity-type semiconductor region and the first second-conductivity-type semiconductor region are arranged in striped layout extending along a first direction parallel to the first main surface of the first parallel pn layer.

In the semiconductor device, the first second-conductivity-type semiconductor region is arranged in a matrix layout, and the first first-conductivity-type semiconductor region is arranged in a lattice shape surrounding a perimeter of the first second-conductivity-type semiconductor region.

In the semiconductor device, the second first-conductivity-type semiconductor region and the second second-conductivity-type semiconductor region are arranged in a striped layout extending along the first direction.

In the semiconductor device, the second first-conductivity-type semiconductor region and the second second-conductivity-type semiconductor region are arranged in a striped layout extending along a first direction parallel to the first main surface of the first parallel pn layer.

In the semiconductor device, the second second-conductivity-type semiconductor region is arranged in a matrix layout, and the second first-conductivity-type semiconductor region is arranged in a lattice shape surrounding a perimeter of the second second-conductivity-type semiconductor region.

In the semiconductor device, the trench is arranged in a striped layout extending along the first direction.

In the semiconductor device, the first parallel pn layer is arranged from an active region to outside the active region, and the second parallel pn layer is arranged outside the active region.

The semiconductor device includes a groove reaching the first semiconductor region from the second semiconductor region. The first electrode contacts the first semiconductor region and the second semiconductor region, inside the groove.

The semiconductor device includes a high-concentration semiconductor region of the first conductivity type between the first electrode and the first semiconductor region, the high-concentration semiconductor region having an impurity concentration higher than that of the first semiconductor region. The first electrode is in contact with the high-concentration semiconductor region and the second semiconductor region.

The semiconductor device includes a first-conductivity-type low-concentration semiconductor region provided between the semiconductor layer and the first first-conductivity-type semiconductor region, the first-conductivity-type low-concentration semiconductor region having an impurity concentration lower than that of the first first-conductivity-type semiconductor region.

According to another aspect of the present invention, a method of manufacturing a semiconductor device having on a first main surface of a semiconductor layer, a first parallel pn layer in which a first first-conductivity-type semiconductor region and a first second-conductivity-type semiconductor region are alternately and repeatedly arranged along a direction parallel to a surface of the semiconductor layer, the first parallel pn layer having a first region and a second region that is thinner than the first region; the semiconductor device having on a surface of the second region, a second parallel pn layer adjacent to the first region and in which a second first-conductivity-type semiconductor region and a second second-conductivity-type semiconductor region are arranged alternately and repeatedly along a direction parallel to a surface of the semiconductor layer, the second first-conductivity-type semiconductor region and the second second-conductivity-type semiconductor region being arranged having a repetition cycle shifted by a half with respect to a repetition cycle of the first first-conductivity-type semiconductor region and the first second-conductivity-type semiconductor region, the method includes repeatedly performing as one set, depositing an epitaxial layer not doped or of a first conductivity type having an impurity concentration lower than that of the semiconductor layer, first ion implanting of a first-conductivity-type impurity in the epitaxial layer, second ion implanting of a second-conductivity-type impurity selectively in the epitaxial layer; and forming on the epitaxial layer deposited by repeatedly performing the one set, a second epitaxial layer not doped or of the first conductivity type having an impurity concentration lower than that of the semiconductor layer. The first parallel pn layer and the second parallel pn layer are formed by performing the one set repeatedly and forming the second epitaxial layer. In repeatedly performing the one set, in a last session of the first ion implanting, ion implanting for forming the first first-conductivity-type semiconductor region and ion implanting for forming the second first-conductivity-type semiconductor region, respectively in the epitaxial layer constituting the first parallel pn layer are performed. In repeatedly performing the one set, in a last session of the second ion implanting, ion implanting for forming the first second-conductivity-type semiconductor region and ion implanting for forming second second-conductivity-type semiconductor region, respectively in the epitaxial layer constituting the first parallel pn layer are performed. The method includes forming a trench in the first first-conductivity-type semiconductor region; forming a gate electrode in the trench, via gate insulating film; forming a first semiconductor region of a second conductivity type in a surface layer of the first parallel pn layer; selectively forming a second semiconductor region of the first conductivity type in a surface layer of the first semiconductor region; forming a first electrode electrically connected to the first semiconductor region and the second semiconductor region; and forming a second electrode electrically connected to the semiconductor layer. The trench is formed to extend from the first first-conductivity-type semiconductor region to the second second-conductivity-type semiconductor region, terminating at the second second-conductivity-type semiconductor region. The gate electrode is formed to extend outside from inside the trench and to remain on a surface of the second parallel pn layer via the gate insulating film.

In the method, the first semiconductor region is formed to be adjacent to the second second-conductivity-type semiconductor region.

In the method, in repeatedly performing the one set, a first-conductivity-type low-concentration semiconductor region having an impurity concentration lower than that of the first first-conductivity-type semiconductor region is formed between the semiconductor layer and the first first-conductivity-type semiconductor region.

The method includes forming a first-conductivity-type high-concentration semiconductor region after forming the first semiconductor region and before selectively forming the second semiconductor region, the first-conductivity-type high-concentration semiconductor region being formed in the surface layer of the first semiconductor region and having an impurity concentration higher than that of the first semiconductor region.

In the method, in repeatedly performing the one set, the first-conductivity-type impurity is selectively ion implanted.

According to another aspect of the present invention, a method of manufacturing a semiconductor device having on a first main surface of a semiconductor layer, a first parallel pn layer in which a first first-conductivity-type semiconductor region and a first second-conductivity-type semiconductor region are alternately and repeatedly arranged along a direction parallel to a surface of the semiconductor layer, the first parallel pn layer having a first region and a second region that is thinner than the first region; the semiconductor device having on a surface of the second region, a second parallel pn layer adjacent to the first region and in which a second first-conductivity-type semiconductor region and a second second-conductivity-type semiconductor region are arranged alternately and repeatedly along a direction parallel to a surface of the semiconductor layer, the second first-conductivity-type semiconductor region and the second second-conductivity-type semiconductor region being arranged having a repetition cycle shifted by a half with respect to a repetition cycle of the first first-conductivity-type semiconductor region and the first second-conductivity-type semiconductor region, the method includes repeatedly performing as one set, depositing an epitaxial layer of a first conductivity type and having an impurity concentration lower than that of the semiconductor layer, and third ion implanting of a second-conductivity-type impurity in the epitaxial layer selectively; and forming on the epitaxial layer deposited by repeatedly performing the one set, a second epitaxial layer of the first conductivity type and having an impurity concentration lower than that of the semiconductor layer. The first parallel pn layer and the second parallel pn layer are formed by performing the one set repeatedly and forming the second epitaxial layer. In repeatedly performing the one set, in a last session of the third ion implanting, ion implanting for forming the first second-conductivity-type semiconductor region and ion implanting for forming the second second-conductivity-type semiconductor region, respectively in the epitaxial layer constituting the first parallel pn layer are performed. The method includes forming a trench in the first first-conductivity-type semiconductor region; forming a gate electrode in the trench, via a gate insulating film; forming a first semiconductor region of a second conductivity type in a surface layer of the first parallel pn layer; selectively forming a second semiconductor region of the first conductivity type in a surface layer of the first semiconductor region; forming a first electrode electrically connected to the first semiconductor region and the second semiconductor region; and forming a second electrode electrically connected to the semiconductor layer. The trench is formed to extend from the first first-conductivity-type semiconductor region to the second second-conductivity-type semiconductor region, terminating at the second second-conductivity-type semiconductor region. The gate electrode is formed to extend outside from inside the trench and to remain on a surface of the second parallel pn layer via the gate insulating film.

In the method, the first semiconductor region is formed to be adjacent to the second second-conductivity-type semiconductor region.

In the method, in repeatedly performing the one set, the epitaxial layer of the first conductivity type is left between the semiconductor layer and the first second-conductivity-type semiconductor region.

The method includes forming a first-conductivity-type high-concentration semiconductor region after forming the first semiconductor region and before selectively forming the second semiconductor region, the first-conductivity-type high-concentration semiconductor region being formed in the surface layer of the first semiconductor region and having an impurity concentration higher than that of the first semiconductor region.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
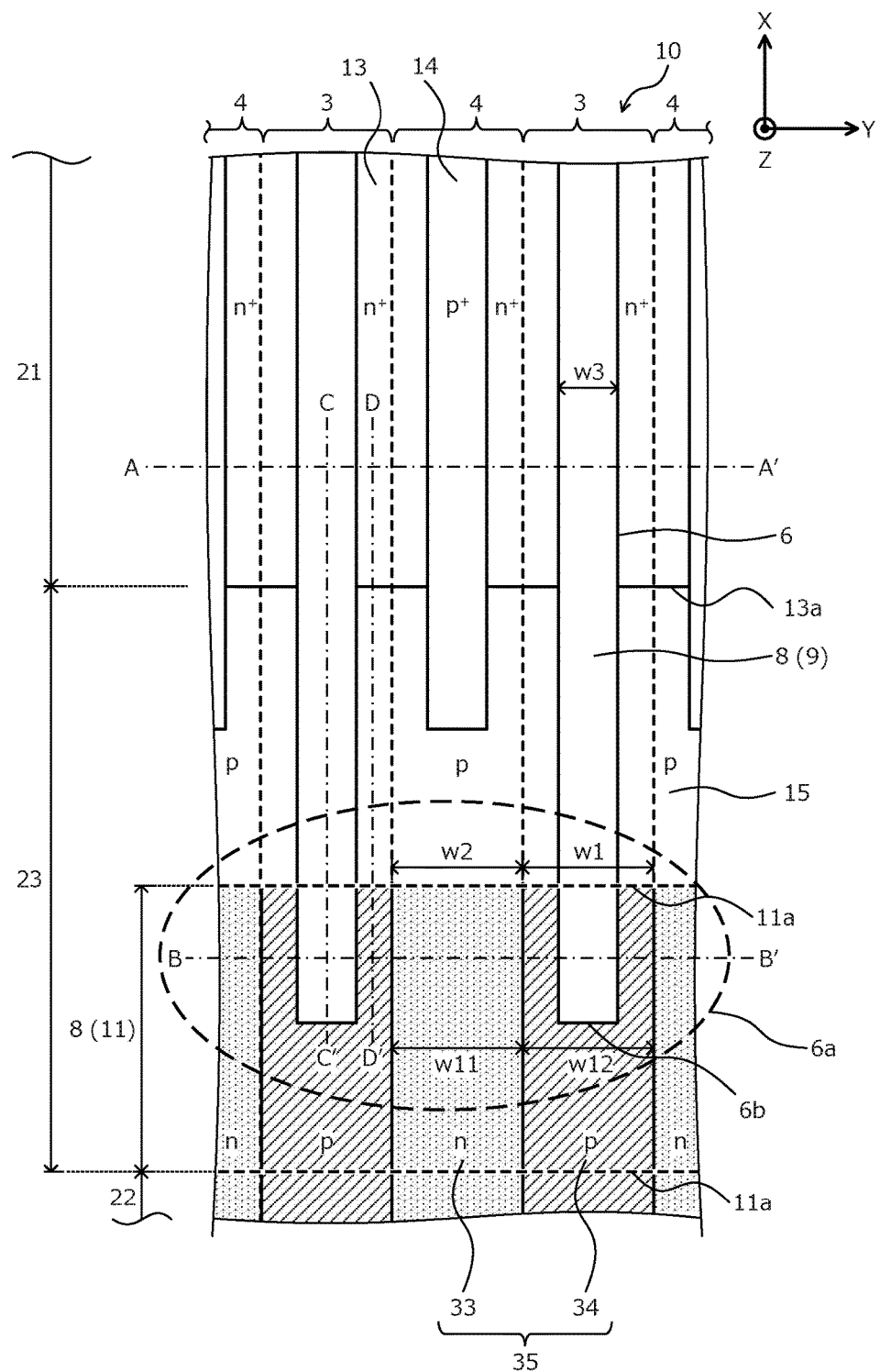
FIG. 1 is a plan view of a planar layout of a portion of a MOS gate of a semiconductor device according to a first embodiment.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 2:
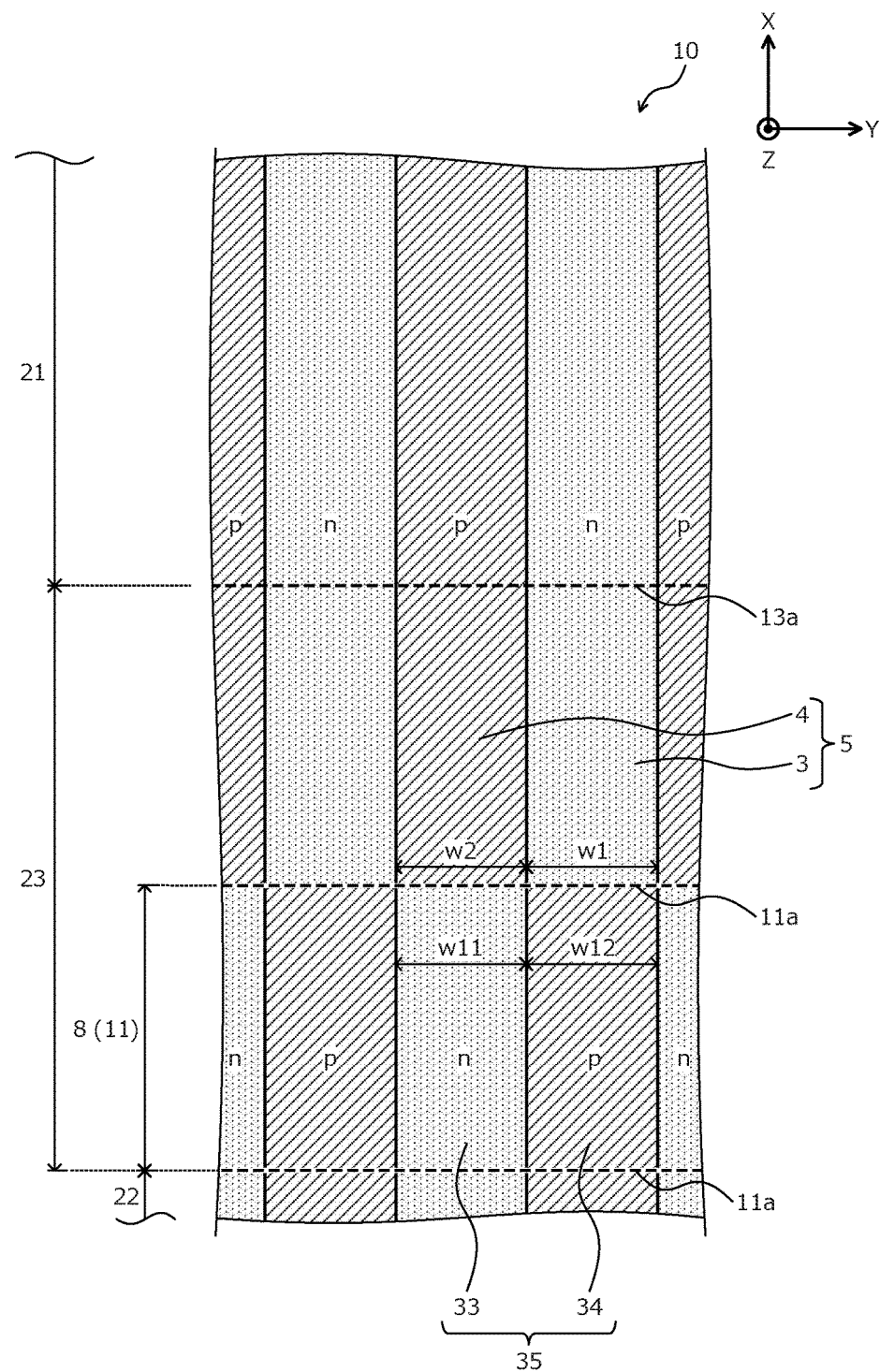
FIGS. 2 and 3 are plan views of a planar layout of a portion of parallel pn layers of the semiconductor device according to the first embodiment.
Figure 3:
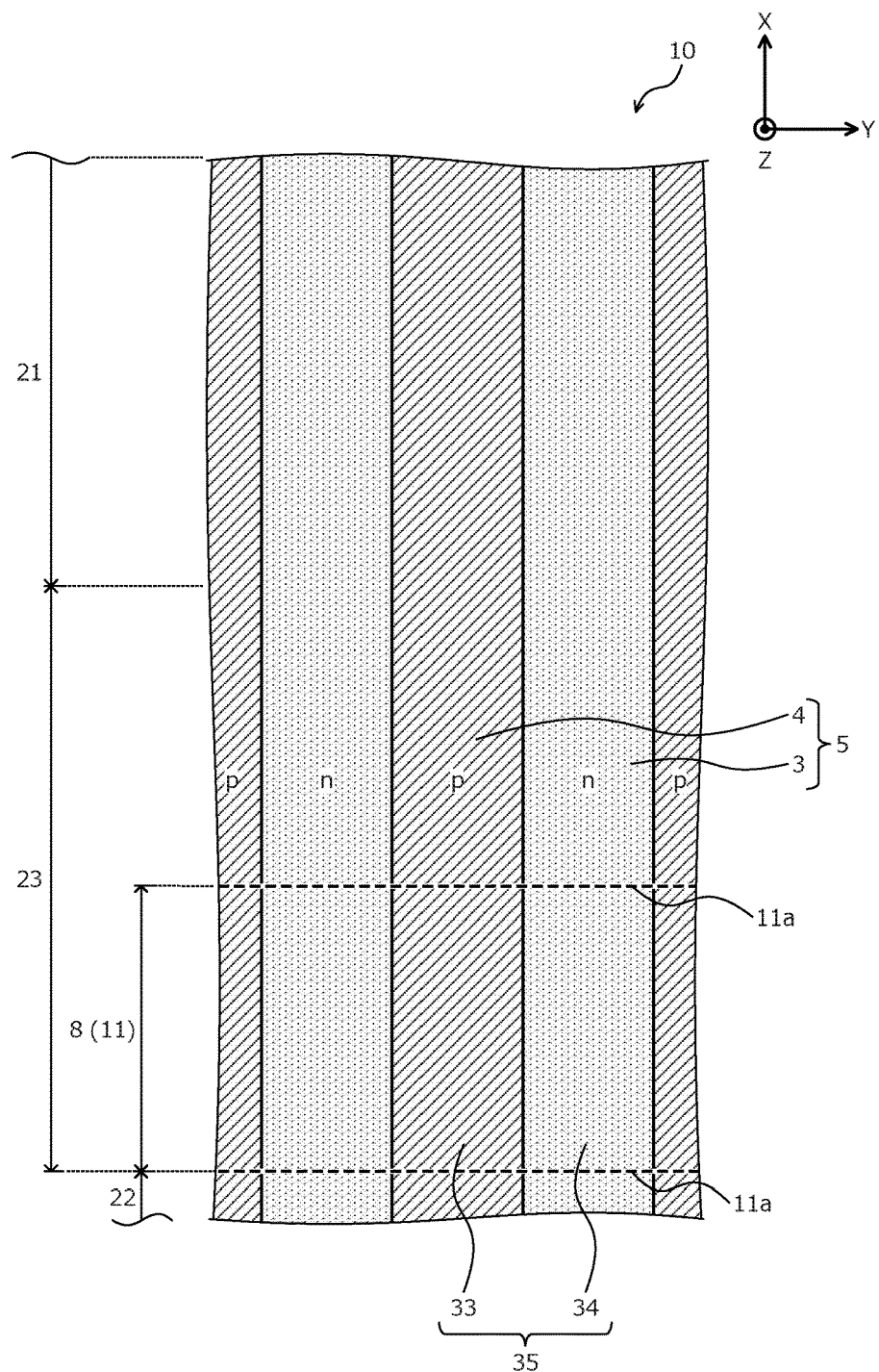

A structure of the semiconductor device according to a first embodiment will be described. FIG. 1 is a plan view of a planar layout of a portion of a MOS gate of the semiconductor device according to the first embodiment. FIGS. 2 and 3 are plan views of a planar layout of a portion of parallel pn layers of the semiconductor device according to the first embodiment. FIG. 2 depicts a planar layout of the parallel pn layers at a surface region (same depth position as in FIG. 1) on a front surface (first main surface) side of a semiconductor base (semiconductor chip) 10. FIG. 3 depicts a planar layout of the parallel pn layers at a depth position farther on a drain side than the surface region (FIG. 2) on the front surface side of the semiconductor base 10. Further, in FIGS. 1 to 3, the n-type region and the p-type region of the parallel pn layers are indicated by respectively different types of hatching (similarly in FIGS. 4, 5A, 5B, 6, and 7).

The semiconductor device according to the first embodiment and depicted in FIG. 1 is a trench-gate-type SJ-MOSFET including, as a drift layer, a first parallel pn layer 5 in which an n-type region (first first-conductivity-type semiconductor region) 3 and a p-type region (first second-conductivity-type semiconductor region) 4, each having an increased impurity concentration, are alternately and repeatedly arranged along a direction parallel to a base main surface. The n-type region 3 and the p-type region 4 may constitute a first pair of semiconductor regions, and the first parallel pn layer 5 includes a plurality of first pairs of semiconductor regions. A surface that a layer including the plurality of first pairs of semiconductor regions are formed may be referred to as a first plane. A planar layout of the first parallel pn layer 5 and a second parallel pn layer 35 of the semiconductor device according to the first embodiment will be described. The n-type region 3 and the p-type region 4 of the first parallel pn layer 5 are arranged in a planar layout having a striped shape extending from an active region 21 to an edge termination region 22, along a direction parallel to a front surface of a semiconductor base (semiconductor chip) 10.

The semiconductor base 10 is an epitaxial substrate formed by stacking on an $n^+$-type semiconductor substrate (semiconductor layer) 1, plural epitaxial layers constituted by an $n^−$-type buffer layer 2 and the first parallel pn layer 5. The $n^−$-type buffer layer 2 may correspond to a low-impurity-concentration semiconductor region of the first conductivity type. The active region 21 is a region through which current flows in the ON state and is a region farther on an inner side than an outermost end portion 13a of an $n^+$-type source region 13 configuring the MOS gate. The $n^+$-type source region 13 may correspond to a high-impurity-concentration semiconductor region of the first conductivity type. The edge termination region 22 is a region surrounding a periphery of the active region 21 and maintaining the breakdown voltage by mitigating the electric field on a base front surface (a front surface of the semiconductor base 10) side of the active region 21. In the edge termination region 22, for example, a breakdown voltage structure such as a guard ring, a junction termination extension (JTE) structure and RESURF, a field plate, etc. is arranged.

In the active region 21, a trench (gate trench) 6 constituting the MOS gate is provided in the n-type region 3 of the first parallel pn layer 5. In the active region 21, the gate trench 6 is arranged in the n-type region 3 of the first parallel pn layer 5, in a planar layout having a striped shape parallel to the direction (the second direction) X in which the n-type region 3 extends in a striped shape. Further, the gate trench 6 extends from the active region 21 toward an outer side (the edge termination region 22 side) and an end portion (gate trench termination portion) 6a terminates in a region (intermediate region) 23 between the active region 21 and the edge termination region 22. In an intermediate region 23, the n$^+$-type source region 13, a breakdown voltage structure such as a guard ring, a junction termination extension structure, RESURF, a field plate, etc. is not arranged.

In the gate trench 6, a MOS gate (trench gate) 9 is embedded. At the gate trench termination portion 6a, a MOS gate (planar gate) 11 having a planar shape is provided on the trench gate 9. In other words, the trench gate 9 faces and is in contact with the planar gate 11 in a depth direction Z. In FIG. 1, the planar gate 11 is a portion between two parallel dashed lines 11a. The planar gate 11, for example, is arranged in a planar layout having substantially a ring shape surrounding a periphery of the active region 21.

The planar gate 11 is electrically connected to a gate pad via a non-depicted gate runner. In FIG. 1, a gate insulating film 7 described hereinafter and constituting the trench gate 9 and the planar gate 11 is not depicted. In the gate trench termination portion 6a, a side wall (end portion side wall) 6b of the gate trench 6, substantially parallel to a direction (the first direction) Y orthogonal to the second direction X is covered by a p-type region 34 of the second parallel pn layer 35 described hereinafter. In other words, the gate trench termination portion 6a terminates in the p-type region 34 of the second parallel pn layer 35.

Further, in the active region 21, a p-type base region 15 is provided between adjacent gate trenches 6 (mesa portion), and an n$^+$-type source region (second semiconductor portion) 13 and a p$^+$-type contact region 14 are each selectively provided in the p-type base region. In FIG. 1, the n-type region 3 and the p-type region 4 of the first parallel pn layer 5 directly beneath (portion on the drain side) the p-type base region 15 are indicated by vertical dashed lines. The p-type base region, the n$^+$-type source region 13, and the p$^+$-type contact region 14 are arranged in a planar layout having a striped shape parallel to the second direction X. The p$^+$-type contact region 14 may extend from the active region 21 to the intermediate region 23.

In the intermediate region 23, at a surface region (surface layer) of the first parallel pn layer 5 on the base front surface side, the second parallel pn layer 35 formed by an n-type region (second first-conductivity-type semiconductor region) 33 and the p-type region (second second-conductivity-type semiconductor region) 34 is provided (FIGS. 1 and 2). The n-type region 33 and the p-type region 34 may constitute a second pair of semiconductor regions, and the second parallel pn layer 35 includes a plurality of second pairs of semiconductor regions. A surface that a layer including the plurality of second pairs of semiconductor regions are formed may be referred to as a second plane. Further, a portion of the n-type region 33 may correspond to a first-conductivity-type low-concentration semiconductor region. The n-type region 33 and the p-type region 34 of the second parallel pn layer 35 are arranged in a planar layout having a striped shape parallel to the second direction X. The second parallel pn layer 35 may extend from the intermediate region 23 to the edge termination region 22 and may further reach the chip end portion. In FIGS. 1 and 2, the second parallel pn layer 35 is depicted in a state extending from the intermediate region 23 to the edge termination region 22.

Further, the n-type region 33 and the p-type region 34 of the second parallel pn layer 35 are arranged having a repetition cycle (repetition pitch) that is shifted ½ a cell along the first direction Y with respect to the repetition cycle of the n-type region 3 and the p-type region 4 of the first parallel pn layer 5. A cell is a configuration unit of an element and the width (width along the first direction Y) of one cell is the same as a repetition pitch (=w1+w2) of the n-type region 3 and the p-type region 4. Widths w11, w12 of the n-type region 33 and the p-type region 34 of the second parallel pn layer 35 are substantially the same as widths w2, w1 of the p-type region 4 and the n-type region 3 of the first parallel pn layer 5, respectively (w11≈w2, w12≈w1).

In other words, the p-type region 4 of the first parallel pn layer 5 and the n-type region 33 of the second parallel pn layer 35 face each other along the second direction X and form a linear planar shape continuous and extending along the second direction X. The n-type region 3 of the first parallel pn layer 5 and the p-type region 34 of the second parallel pn layer 35 face each other along the second direction X and form a linear planar shape continuous and extending along the second direction X. In the n-type region 3 and the p-type region 34 of a continuous linear shape from the active region 21 to the intermediate region 23, the gate trench 6 is arranged and as described above, the gate trench termination portion 6a terminates in the p-type region 34.

Figure 4:
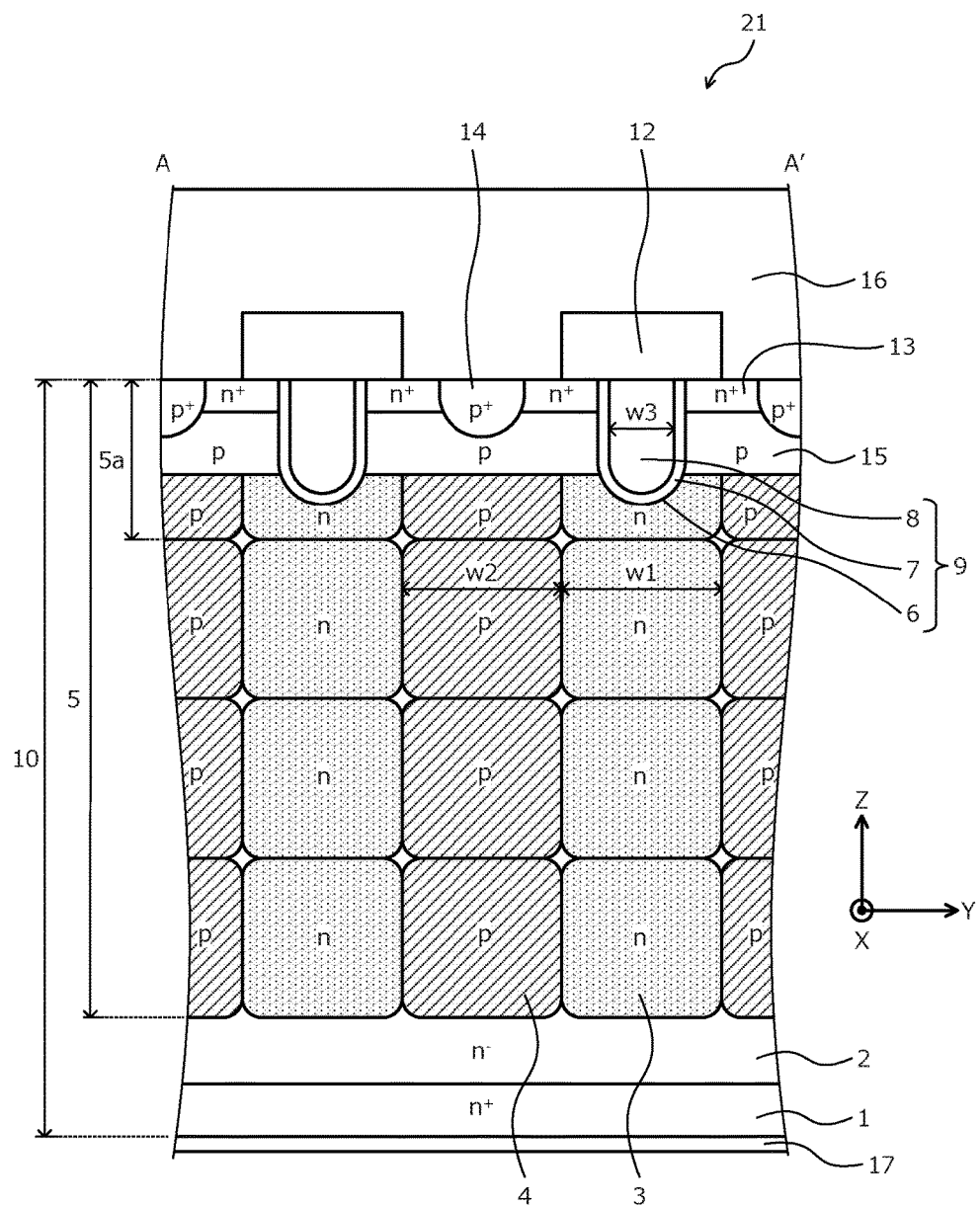
FIG. 4 is a cross-sectional view at a cutting line A-A' in FIG. 1.
Figure 5A:
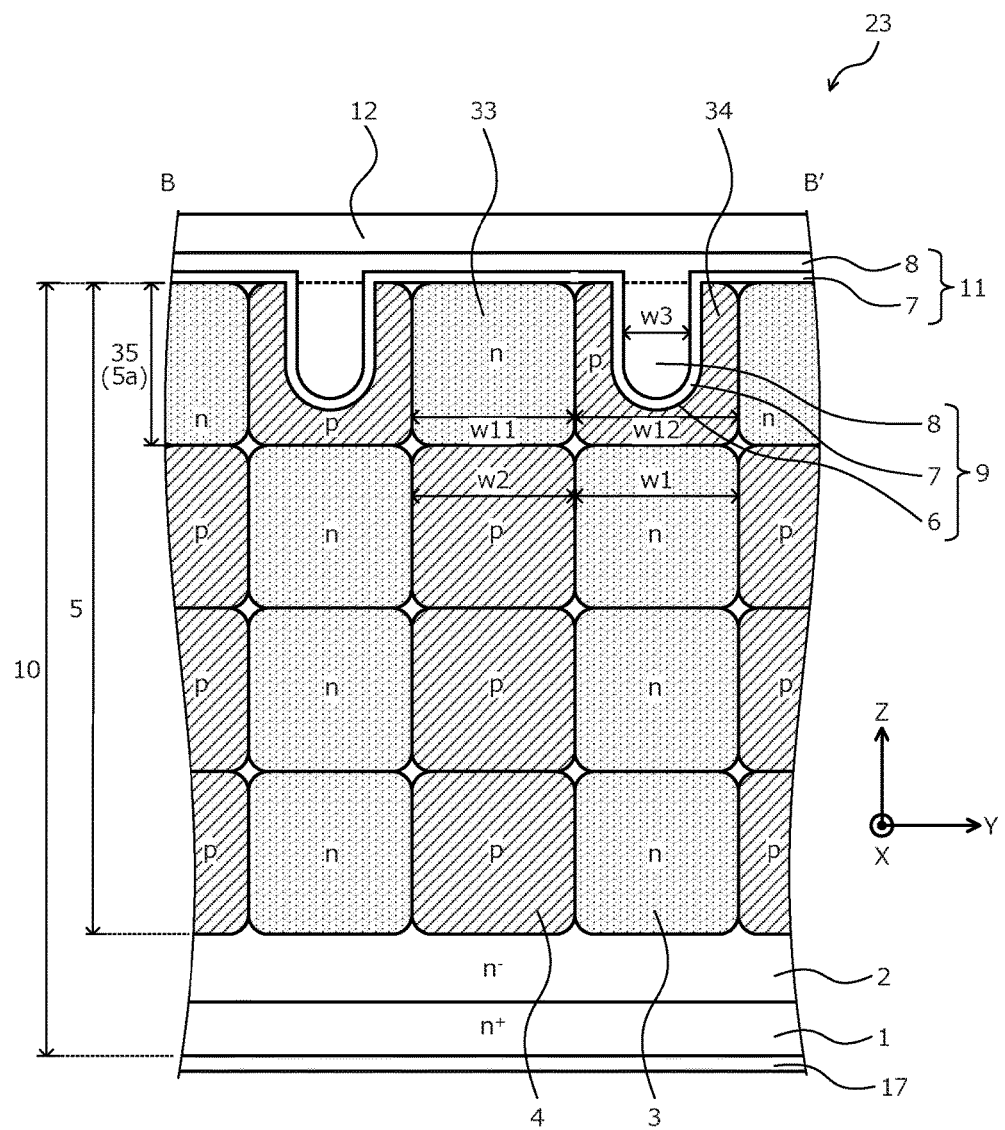
FIG. 5A is a cross-sectional view at a cutting line B-B' in FIG. 1.
Figure 5B:
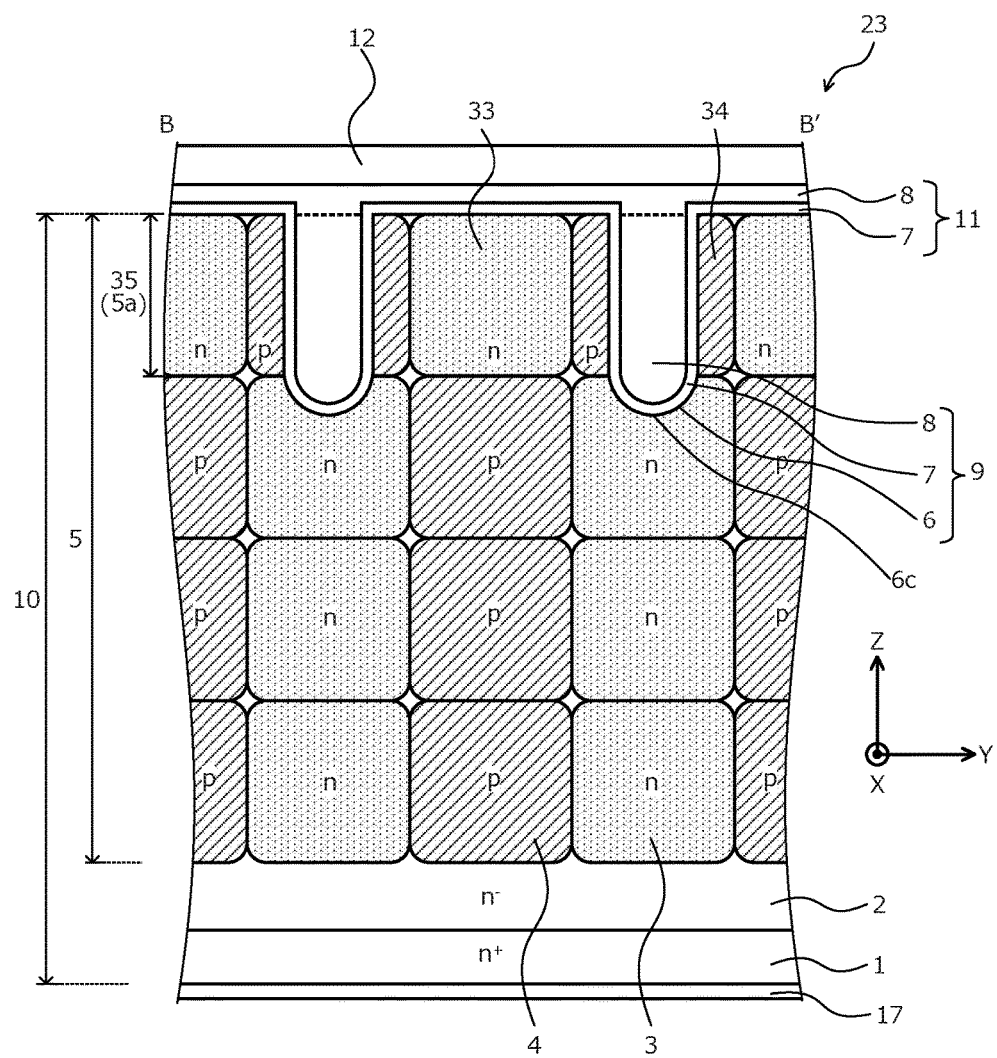
FIG. 5B is another example of a cross-sectional view at the cutting line B-B' in FIG. 1.
Figure 6:
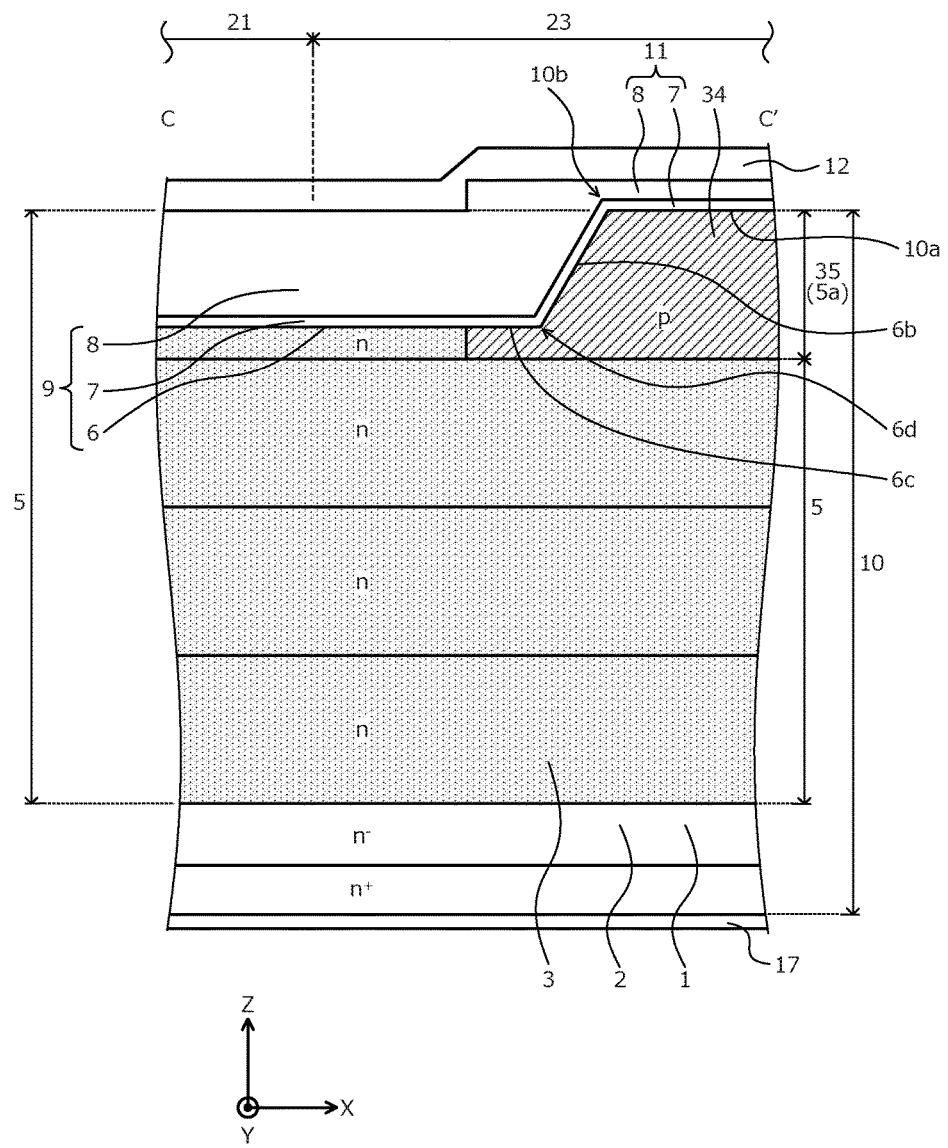
FIG. 6 is a cross-sectional view at a cutting line C-C' in FIG. 1.
Figure 7:
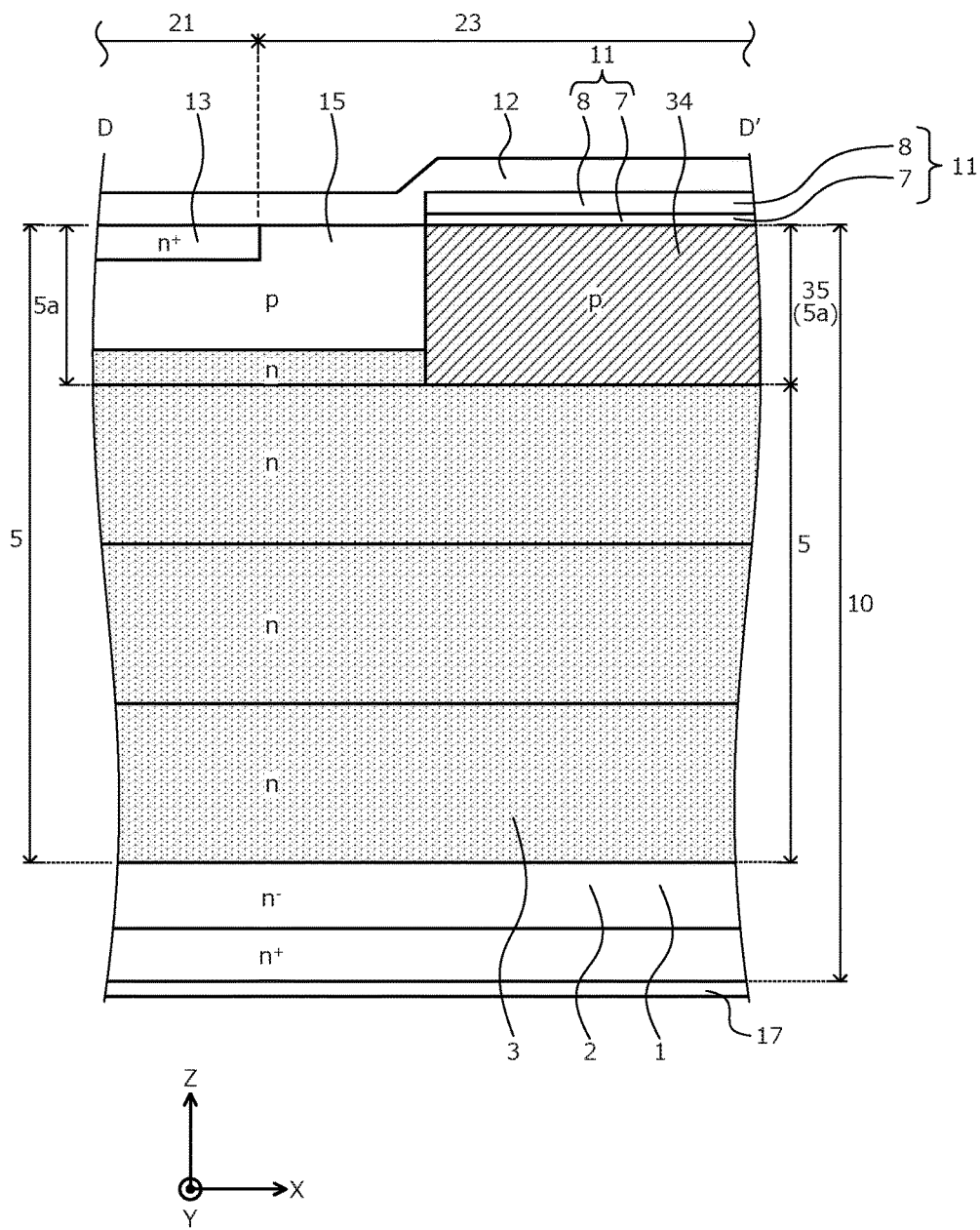
FIG. 7 is a cross-sectional view at a cutting line D-D' in FIG. 1.

A cross-sectional structure of the semiconductor device according to the first embodiment will be described. FIG. 4 is a cross-sectional view at a cutting line A-A' in FIG. 1. FIG. 5A is a cross-sectional view at a cutting line B-B' in FIG. 1. FIG. 5B is another example of a cross-sectional view at the cutting line B-B' in FIG. 1. FIG. 6 is a cross-sectional view at a cutting line C-C' in FIG. 1. FIG. 7 is a cross-sectional view at a cutting line D-D' in FIG. 1. On the n$^+$-type semiconductor substrate 1 being an n$^+$-type drain layer, the first parallel pn layer 5 is provided via the n$^-$-type buffer layer 2.

On the n$^+$-type semiconductor substrate 1, for example, the n$^-$-type buffer layer 2 and the first parallel pn layer 5 are sequentially formed and stacked by an epitaxial growth method whereby the semiconductor base 10 is formed. The first parallel pn layer 5, for example, is formed by repeatedly performing as one set for each deposition of an epitaxial layer having an impurity concentration (n$^-$-type) lower than that of the n$^+$-type semiconductor substrate 1 or a non-doped epitaxial layer, ion implantation of an n-type impurity for forming the n-type region 3 in the epitaxial layer and ion implantation of a p-type impurity for forming the p-type region 4.

Further, the first parallel pn layer 5 may be formed by repeatedly performing as one set for each deposition of an epitaxial layer having an impurity concentration lower than that of the n$^+$-type semiconductor substrate 1 or a non-doped epitaxial layer, ion implantation of an n-type impurity to the entire surface of the epitaxial layer and ion implantation of a p-type impurity for forming the p-type region 4. The first parallel pn layer 5 may be formed by repeatedly performing for each deposition of an epitaxial layer having an impurity concentration substantially the same as that of the n-type region 3, ion implantation of a p-type impurity for forming the p-type region 4 in the n-type epitaxial layer. At the uppermost epitaxial layer level, an epitaxial layer having an impurity concentration that is lower than that of the n$^+$-type semiconductor substrate 1 or a non-doped epitaxial layer is formed without performing ion implantations of an n-type impurity and a p-type impurity.

FIG. 4 depicts the first parallel pn layer 5 formed by repeatedly performing as one set for each deposition of an epitaxial layer, ion implantation of an n-type impurity for forming the n-type region 3 and ion implantation of a p-type impurity for forming the p-type region 4. In FIG. 4, the n-type regions 3 having a substantially rectangular cross-sectional shape adjacent along the depth direction Z and the p-type regions 4 having a substantially rectangular cross-sectional shape adjacent along the depth direction Z are regions formed by thermally diffusing impurity regions formed by ion implantation performed with respect to respectively differing epitaxial layers (similarly in FIGS. 5A, 5B, 6, and 7).

Total impurity amounts of the n-type region 3 and the p-type region 4 of the first parallel pn layer 5 are set to be roughly same and are set so that in the respective regions, impurity concentrations along the depth direction become roughly uniform. For example, when the widths w1, w2 of the n-type region 3 and the p-type region 4 of the first parallel pn layer 5 are the same and the impurity concentrations in the n-type region 3 and the p-type region 4 are set to be roughly the same, the total impurity amounts of both regions may be set to be roughly the same. As a result, the charge balance of the impurity concentrations of the n-type region 3 and the p-type region 4 of the first parallel pn layer 5 is maintained.

In the active region 21, the gate trench 6 is provided in a surface region on the base front surface side of the n-type region 3 of the first parallel pn layer 5. A width (width along the first direction Y) w3 of the gate trench 6 is narrower than the width w1 of the n-type region 3 of the first parallel pn layer 5 (w3<w1). As a result, in the ON state, a channel (n-type inversion layer) becoming a path of current flowing between the n$^+$-type source region 13 and the n-type region 3 of the first parallel pn layer 5 is formed in the p-type base region (first semiconductor portion) 15.

In the gate trench 6, a gate electrode 8 is provided on the gate insulating film 7. The gate insulating film 7 and the gate electrode 8 in the gate trench 6 constitute the trench gate 9. A portion of the gate insulating film 7, for example, along a bottom surface 6c of the gate trench 6 may be relatively thicker. By making the portion of the gate insulating film 7 along the bottom surface 6c of the gate trench 6 thicker, the electric field applied to the gate insulating film 7 at the bottom surface 6c of the gate trench 6 may be mitigated.

Between adjacent gate trenches 6 (at a mesa portion), the p-type base region 15 is provided spanning between the adjacent gate trenches 6. The depth of the p-type base region 15 is shallower than the depth of the gate trench 6. Preferably, the p-type base region 15 may be in contact with the p-type region 34 of the second parallel pn layer 35. In other words, an outermost end portion of the p-type base region 15 along the second direction X may be preferably positioned at a boundary of the active region 21 and the intermediate region 23. The reason for this is that the charge balance of the impurity concentration of the n-type region 3 of the first parallel pn layer 5 and the impurity concentration of the p-type base region 15 and the p-type region 4 of the first parallel pn layer 5 is easy to maintain.

Further, preferably the charge balance of the impurity concentration of the n-type region 3 of the first parallel pn layer 5 and the impurity concentration of the p-type region 4 of the first parallel pn layer 5 and the p-type base region 15 may be maintained within a permissible range, and the position of the outermost end portion of the p-type base region 15 along the second direction X may be changed variously. For example, the p-type base region 15 may be arranged to be separate from the p-type region 34 of the second parallel pn layer 35 and, for example, may be arranged so as to overlap an inner-side end portion of the p-type region 34 of the second parallel pn layer 35 by thermal diffusion, etc.

In the p-type base region 15, the n$^+$-type source region 13 and the p$^+$-type contact region 14 are each selectively provided. The n$^+$-type source region 13 faces the gate electrode 8 across the gate insulating film 7 provided on a side wall of the gate trench 6. The p$^+$-type contact region 14 is in contact with the n$^+$-type source region 13. The depth of the p$^+$-type contact region 14 may be deeper than that of the n$^+$-type source region 13.

A source electrode (first electrode) 16 is in contact with the n$^+$-type source region 13 and the p$^+$-type contact region 14, and is electrically connected to the n$^+$-type source region 13 and the p-type base region 15. Further, the source electrode 16 is electrically insulated from the gate electrode 8 by an interlayer insulating film 12. The source electrode 16 is embedded in a groove (not depicted) provided in the mesa portion at a depth not penetrating the p-type base region 15, and the n$^+$-type source region 13 and the p$^+$-type contact region 14 may be in contact with each other in the groove.

Between the source electrode 16 and a semiconductor portion (the semiconductor base 10), a barrier metal (not depicted) may be provided. The barrier metal may extend between the source electrode 16 and the interlayer insulating film 12. The barrier metal, for example, contains a metal having high adhesiveness with the semiconductor portion and capable of forming an ohmic contact with the semiconductor portion. Further, the barrier metal, for example, has a function of preventing the diffusion of metal atoms from the source electrode 16 to the semiconductor base 10 side and the interlayer insulating film 12 side. A drain electrode (second electrode) 17 is provided on a rear surface (second main surface: a surface of the n$^+$-type semiconductor substrate 1) of the semiconductor base 10.

As depicted in FIGS. 5A and 6, the gate trench 6 extends from the active region 21 toward the outside and the end portion thereof (gate trench termination portion 6a) terminates in the intermediate region 23. The gate insulating film 7 and the gate electrode 8 in the gate trench 6 extend from inside the gate trench 6, onto a base front surface 10a and toward the outside. The portion of the gate insulating film 7 and the gate electrode 8 extending onto the base front surface 10a is the planar gate 11. The planar gate 11 extends toward the inner side (the active region 21 side) and, faces and is in contact with the trench gate 9 in the depth direction Z. The gate electrode 8 constituting the planar gate 11 is electrically insulated from the source electrode 16 by the interlayer insulating film 12.

The n-type region 33 and the p-type region 34 of the second parallel pn layer 35 are provided in a surface region of the first parallel pn layer 5 on the base front surface 10a side in the intermediate region 23. The n-type region 33 and the p-type region 34 of the second parallel pn layer 35 are in contact with the p-type region 4 and the n-type region 3 of the first parallel pn layer 5 in the depth direction Z, respectively. By arranging the second parallel pn layer 35 in this manner, the end-portion side wall 6b of the gate trench 6 may be covered by the p-type region 34 of the second parallel pn layer 35 without loss the charge balance of the impurity concentrations of the n-type regions and the p-type regions of the parallel pn layers (the first and second parallel pn layers 5, 35).

The p-type region 34 of the second parallel pn layer 35 is arranged to at least cover the end-portion side wall 6b of the gate trench 6 at a pointed portion 10b of a silicon portion (the semiconductor base 10) generated at a boundary of the front surface 10a of the semiconductor base 10 and the end-portion side wall 6b of the gate trench 6. Although FIGS. 4, 5A, 6, and 7 depict a case in which the depth position of the p-type region 34 of the second parallel pn layer 35 (depth position from the base front surface 10a) is farther on the drain side that the depth position of the bottom surface 6c of the gate trench 6 is, as depicted in FIG. 5B, the depth position of the p-type region 34 of the second parallel pn layer 35 may be farther on the source side than the depth position of the bottom surface 6c of the gate trench 6 is.

In other words, configuration may be such that the p-type region 34 of the second parallel pn layer 35 does not cover the drain side of the end-portion side wall 6b of the gate trench 6. In this case, for example, as described hereinafter, the present invention is applicable when plural $n^-$-type epitaxial layers are stacked forming a parallel pn layer and the thickness of an $n^-$-type epitaxial layer 5a that is the uppermost layer stacked last is thinner that the thicknesses of the other $n^-$-type epitaxial layers. For example, the thickness of a portion of the gate insulating film 7 along the bottom surface 6c of the gate trench 6 is made relatively thicker whereby the electric field applied near the bottom surface 6c of the gate trench 6 not covered by the p-type region 34 of the second parallel pn layer 35 is mitigated.

Further, a width w12 of the p-type region 34 of the second parallel pn layer 35 may be preferably wider than a width w3 of the gate trench 6 (w12>w3), irrespective of the depth of the gate trench 6. Further, the p-type region 34 of the second parallel pn layer 35 may be preferably arranged so as to entirely cover the end-portion side wall 6b of the gate trench 6. More preferably, the p-type region 34 of the second parallel pn layer 35 is arranged so as to cover a boundary 6d of the end-portion side wall 6b of the gate trench 6 and the bottom surface 6c and is arranged so as to extend from the boundary 6d by a predetermined width toward the inner side to cover the bottom surface 6c of the gate trench 6.

The method of manufacturing a semiconductor device according to the first embodiment will be described. First, the $n^+$-type semiconductor substrate (semiconductor wafer) 1 constituting the $n^+$-type drain layer is prepared. Next, on the front surface of the $n^+$-type semiconductor substrate 1, an $n^-$-type epitaxial layer constituting the $n^-$-type buffer layer 2 is deposited (formed) by an epitaxial growth method. Next, on the $n^-$-type buffer layer 2, an $n^-$-type epitaxial layer having a lower impurity concentration than that of the n-type region 3 of the first parallel pn layer 5 is deposited by an epitaxial growth method. At this time, a non-doped epitaxial layer may be deposited.

Next, on the surface of the $n^-$-type epitaxial layer, an ion implantation mask is formed using, for example, a resist material or an oxide film ($SiO_2$) and has an open portion corresponding to a formation region of the p-type region 4 of the first parallel pn layer 5. Next, a p-type impurity such as boron (B) is ion implanted using the ion implantation mask as a mask. As a result, on the surface layer of the $n^-$-type epitaxial layer, a p-type impurity region constituting the p-type region 4 of the first parallel pn layer 5 is selectively formed and the ion implantation mask is removed.

Next, on the surface of the $n^-$-type epitaxial layer, an ion implantation mask is formed using, for example, a resist material or an oxide film and has an open portion corresponding to a formation region of the n-type region 3 of the first parallel pn layer 5. Next, an n-type impurity such as phosphorus (P) is ion implanted using the ion implantation mask as a mask. As a result, on the surface layer of the $n^-$-type epitaxial layer, an n-type impurity region constituting the n-type region 3 of the first parallel pn layer 5 is selectively formed. Subsequently, the ion implantation mask is removed.

The sequence in which the p-type impurity region and n-type impurity region are formed may be interchanged. Further, the n-type impurity region may be formed on the entire surface of the $n^-$-type epitaxial layer without using an ion implantation mask and the p-type impurity region may be selectively formed in the n-type impurity region. Further, in place of the $n^-$-type epitaxial layer, an n-type epitaxial layer having an impurity concentration that is the same as that of the n-type region 3 of the first parallel pn layer 5 may be deposited on the $n^-$-type buffer layer 2 and the ion implantation for forming the n-type impurity region may be omitted.

Next, an $n^-$-type epitaxial layer is newly deposited so as to cover the n-type impurity region and the p-type impurity region (i.e., increase the thickness of the $n^-$-type epitaxial layer). Next, by the method described above, in the newly deposited $n^-$-type epitaxial layer, the p-type impurity region and the n-type impurity region are each selectively formed. The p-type impurity region and the n-type impurity region are arranged so as to respectively face, in the depth direction, the p-type impurity region and the n-type impurity region in the $n^-$-type epitaxial layer directly below.

In this manner, deposition of the $n^-$-type epitaxial layer, formation of the p-type impurity region and formation of the n-type impurity region are repeatedly performed as one set of processes. Further, in repeating the one set of processes, in the $n^-$-type epitaxial layer 5a that is the uppermost layer and stacked last, in a formation region of the intermediate region 23 (or a formation region of the edge termination region 22 from the intermediate region 23), an n-type impurity region and a p-type impurity region constituting the n-type region 33 and the p-type region 34 of the second parallel pn layer 35 are also formed. Formation of the n-type impurity region and the p-type impurity region constituting the n-type region 33 and the p-type region 34 of the second parallel pn layer 35 may be controlled by changing the pattern of the ion implantation mask.

In particular, at a portion of the ion implantation mask for forming the n-type impurity region (the portion corresponding to the intermediate region 23), an open portion is formed having a repetition cycle shifted ½ a cell along the first direction Y with respect to the repetition cycle of an open portion corresponding to a formation region of the n-type region 3 of the first parallel pn layer 5 of the active region 21. In addition, at a portion of the ion implantation mask for forming the p-type impurity region (the portion corresponding to the intermediate region 23), an open portion is formed having a repetition cycle shifted ½ a cell along the first direction Y with respect to the repetition cycle of an open portion corresponding to a formation region of the p-type region 4 of the first parallel pn layer 5 of the active region 21.

As a result, in the $n^-$-type epitaxial layer, the n-type impurity regions are formed to be separate from each other so as to face each other in the depth direction and the p-type impurity regions are formed to be separate from each other so as to face each other in the depth direction. Further, in the $n^-$-type epitaxial layer that is the uppermost layer and constitutes the first parallel pn layer 5, in the intermediate region 23, the n-type impurity region and the p-type impurity region are formed having a repetition cycle that is shifted ½ a cell along the first direction Y with respect to the repetition cycle of the n-type impurity region and the p-type impurity region formed in the n⁻-type epitaxial layer directly below.

Next, impurity regions in the n⁻-type epitaxial layer are diffused by heat treatment (drive) whereby impurity regions facing each other in the depth direction Z are connected; and n-type impurity regions and p-type impurity regions adjacent along the first direction Y are connected. As a result, the n-type regions 3 and the p-type regions 4 of the first parallel pn layer 5 are formed. In the intermediate region 23, the n-type region 33 and the p-type region 34 of the second parallel pn layer 35 are formed having a repetition cycle that is shifted ½ a cell along the first direction Y with respect to the repetition cycle of the n-type region 3 and the p-type region 4 of the first parallel pn layer 5.

By the processes up to here, the semiconductor base 10 is formed in which the n⁻-type buffer layer 2 and the parallel pn layers (the first and second parallel pn layers 5, 35) are sequentially stacked on the n⁺-type semiconductor substrate 1. Next, by an ordinary method, a thick oxide film (not depicted) such as a local oxidation of silicon (LOCOS) is formed on the front surface (surface of the parallel pn layers) of the semiconductor base 10. This thick oxide film, for example, functions as an element isolation region that provides electrical isolation from other elements arranged beyond the edge termination region 22.

Next, on the front surface of the semiconductor base 10, an etching mask having an open portion corresponding to a formation region of the gate trench 6 is formed using, for example, a resist material or an oxide film. Next, etching is performed using the etching mask as a mask, and the gate trench 6 is formed from the n-type region 3 of the first parallel pn layer 5 to the p-type region 34 of the second parallel pn layer 35, having the gate trench termination portion 6a that terminates in the intermediate region 23. Here, the opening width of the etching mask may be controlled to be a predetermined width whereby dimension control of the width w3 of the gate trench 6 to be suitable with respect to the width w12 of the p-type region 34 of the second parallel pn layer 35 is possible.

Next, along an inner wall of the gate trench 6 and the front surface of the semiconductor base 10, the gate insulating film 7 is formed. Next, a poly-silicon (poly-Si) layer is formed on the front surface of the semiconductor base 10 so as to be embedded in the gate trench 6. The poly-silicon layer is patterned by photolithography and etching, leaving a portion constituting the gate electrode 8. In other words, a portion of the poly-silicon layer constituting the trench gate 9 is left in the gate trench 6 and a portion of the poly-silicon layer constituting the planar gate 11 is left on the front surface 10a of the semiconductor base 10 near the gate trench termination portion 6a.

The gate insulating film 7 is patterned by photolithography and etching, exposing a portion where a semiconductor region (the p-type base region 15, guard ring, etc.) is formed at a subsequent process. Next, on the surface layer of the front surface of the semiconductor base 10, an ion implantation mask is formed using, for example, a resist material or an oxide film and has an open portion corresponding to a formation region of the p-type base region 15. Next, for example, ion implantation of a p-type impurity such as boron is performed using the ion implantation mask and the gate electrode 8 as a mask, selectively forming the p-type base region 15 in the surface layer on the front surface of the semiconductor base 10. Subsequently, the ion implantation mask is removed.

Next, the p-type base region 15 is diffused by heat treatment (drive). A guard ring (p-type region) of the edge termination region 22 may be formed together with the p-type base region 15. Next, ion implantation mask formation, ion implantations of differing conditions (ion species, dose amount, acceleration energy, etc.), and ion implantation mask removal are repeatedly performed as one set of processes, and the n⁺-type source region 13 and the p⁺-type contact region 14 are each selectively formed in the surface layer on the front surface of the semiconductor base 10. The ion species (dopant) of the ion implantation for forming the n⁺-type source region 13 may be, for example, arsenic (As).

Next, the interlayer insulating film 12 is deposited on the entire front surface of the semiconductor base 10. The interlayer insulating film 12 is patterned by photolithography and etching, and a contact hole is formed, exposing the n⁺-type source region 13 and the p⁺-type contact region 14. Next, the interlayer insulating film 12 is planarized by heat treatment (reflow). By this heat treatment, the n⁺-type source region 13 and the p⁺-type contact region 14 are activated. Next, a metal film constituting the source electrode 16 is deposited on the interlayer insulating film 12 and patterned so as to be embedded in the contact hole. A gate pad may be formed together with the source electrode 16.

A surface protection film such as a passivation film (not depicted) is formed, protecting the front surface of the semiconductor base 10. Next, the semiconductor base 10 is ground from the rear surface side, up to a position of a product thickness used for a semiconductor device. Next, the drain electrode 17 is formed on the ground rear surface (surface of the n⁺-type semiconductor substrate 1) of the semiconductor base 10. Thereafter, the semiconductor wafer is cut (diced) into individual chips whereby the trench-gate-type SJ-MOSFET depicted in FIGS. 1 to 7 is completed.

As described above, according to the first embodiment, in a surface region on the base front surface side of the first parallel pn layer in the intermediate region, the second parallel pn layer is arranged and the gate trench termination portion is covered by the p-type region of the second parallel pn layer whereby the electric field applied to the gate trench termination portion may be mitigated. As a result, gate breakdown voltage and gate reliability may be enhanced. The gate breakdown voltage is the gate voltage limit at which element destruction does not occur (i.e., the maximum gate voltage that may be applied to the gate electrode).

Further, according to the first embodiment, the n-type region and the p-type region of the second parallel pn layer are arranged having a repetition cycle shifted by ½ with respect to the repetition cycle of the n-type region and the p-type region of the first parallel pn layer whereby the charge balance of the impurity concentrations of the n-type region and the p-type region of the first parallel pn layer is not lost. Therefore, decreases in the breakdown voltage (drain breakdown voltage) may be prevented. The drain breakdown voltage is the drain voltage limit at which element destruction does not occur (i.e., the maximum voltage that may be applied between the source and the drain).

Figure 8:
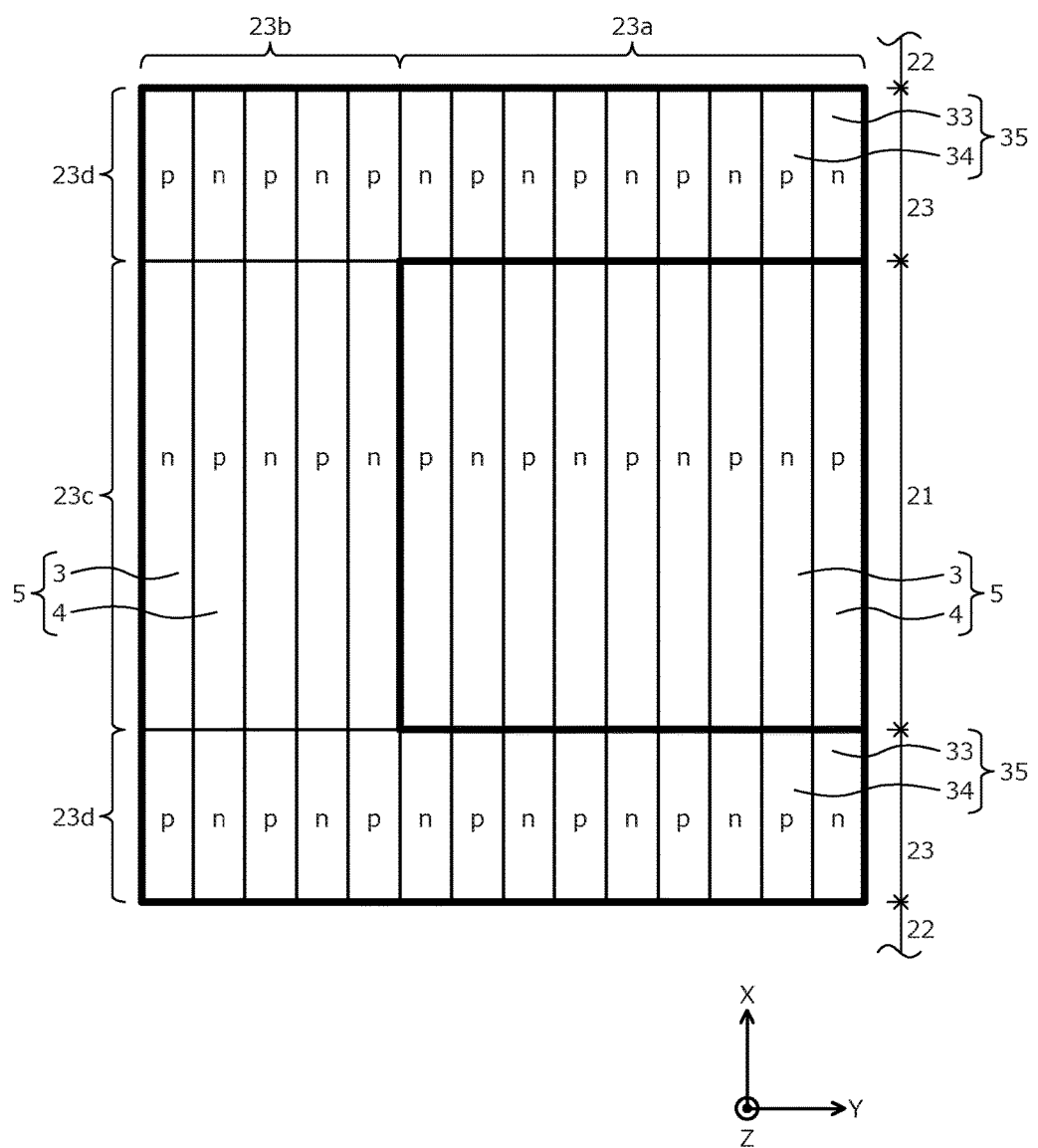
FIG. 8 is a plan view of a planar layout of the parallel pn layers in a surface region on a base front surface of the semiconductor device according to a second embodiment.

As a second embodiment, an example of a planar layout of the first and second parallel pn layers 5, 35 in a surface region on the base front surface side of the semiconductor device according to the first embodiment will be described. FIG. 8 is a plan view of a planar layout of the parallel pn layers in a surface region on the base front surface of the semiconductor device according to the second embodiment. FIG. 8 is equivalent to a planar view depicting the first and second parallel pn layers 5, 35 (refer to FIG. 2) of the first embodiment over the entire regions of the active region 21 and the intermediate region 23. In other words, FIG. 8 is a planar layout of the surface region on the base front surface side of the parallel pn layers (similarly in FIG. 9). In FIG. 8, the active region 21 and the intermediate region 23 are outlined by a thick line.

As depicted in FIG. 8, the active region 21 has, for example, a substantially rectangular planar shape. In the active region 21, the n-type region 3 and the p-type region 4 of the first parallel pn layer 5 are arranged over the entire active region 21 in a planar layout having a striped shape parallel to the second direction X. In a periphery of the active region 21, the intermediate region 23 is arranged to be adjacent thereto along at least the second direction X. In other words, the intermediate region 23 is arranged so as to include at least a terminal end position (gate trench termination portion (6a) of the gate trench 6 extending from the active region 21.

In particular, the intermediate region 23, for example, may have a U-shaped planar shape surrounding a perimeter corresponding to three sides of the active region 21. In a region (hereinafter, first region) 23a of the intermediate region 23 adjacent to the active region 21 along the second direction X, in a surface region on the base front surface side, the n-type region 33 and the p-type region 34 of the second parallel pn layer 35 are arranged in a planar layout having a striped shape parallel to the second direction X. In the first region 23a of the intermediate region 23, the n-type region 33 and the p-type region 34 of the second parallel pn layer 35, similar to the first embodiment, face the p-type region 4 and the n-type region 3 of the first parallel pn layer 5 along the second direction X, respectively.

In a region (hereinafter, second region) 23b of the intermediate region 23 other than the first region 23a, in a portion (hereinafter, first portion) 23c thereof adjacent to the active region 21 along the first direction Y, the n-type region 3 and the p-type region 4 of the first parallel pn layer 5 continuous from the active region 21 are alternately arranged along the first direction Y, repeatedly. In the second region 23b of the intermediate region 23, in a portion (hereinafter, second portion) 23d thereof other than the first portion 23c, the n-type region 33 and the p-type region 34 of the second parallel pn layer 35 continuous from the first region 23a of the intermediate region 23 are alternately arranged along the first direction Y, repeatedly.

Figure 9:
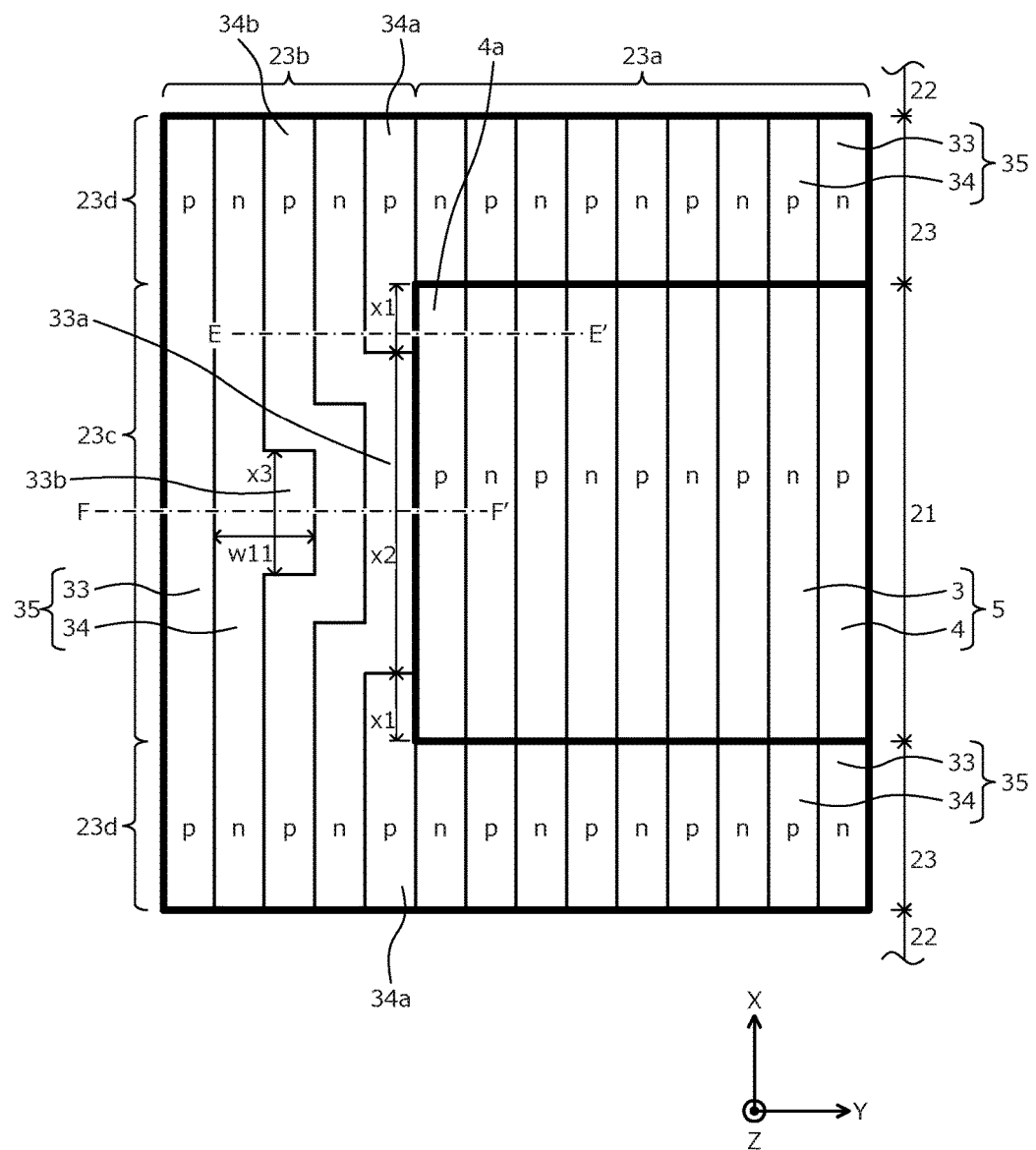
FIG. 9 is a plan view of another example of the planar layout of the parallel pn layers in the surface region on the base front surface of the semiconductor device according to the second embodiment.
Figure 10:
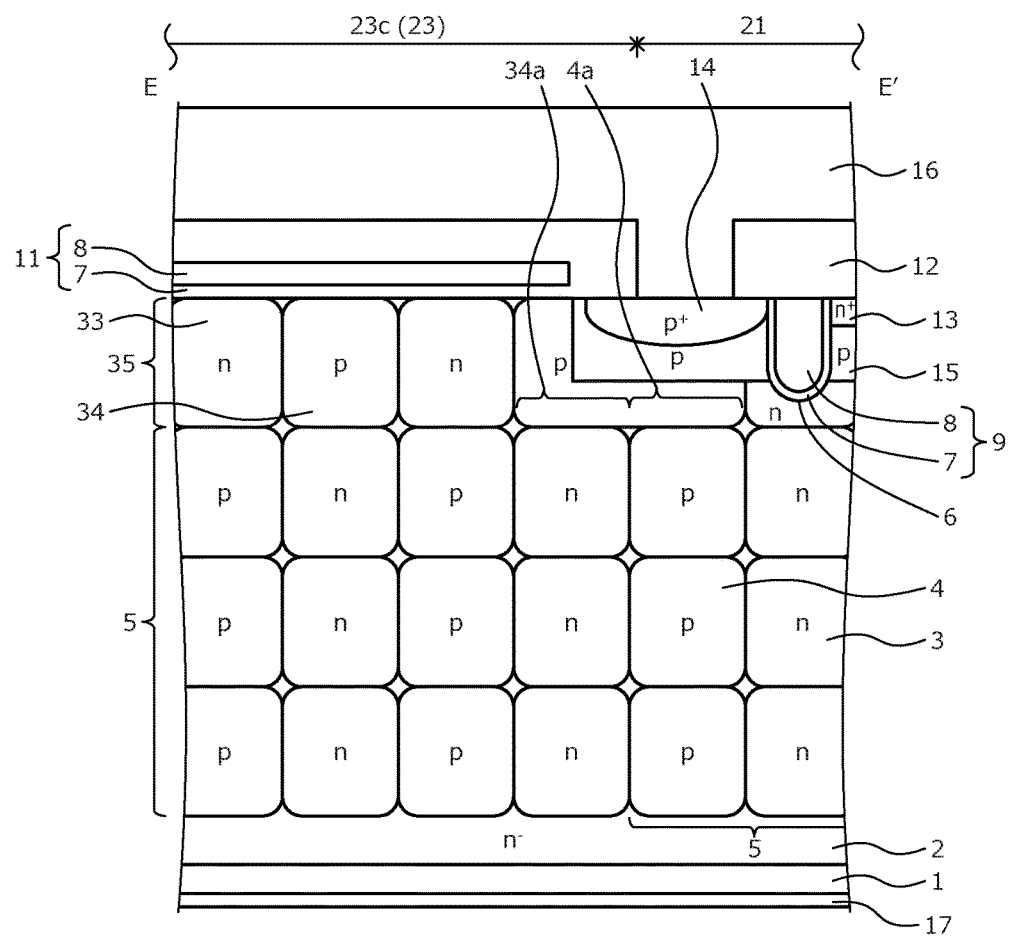
FIG. 10 is a cross-sectional view at a cutting line E-E' in FIG. 9.
Figure 11:
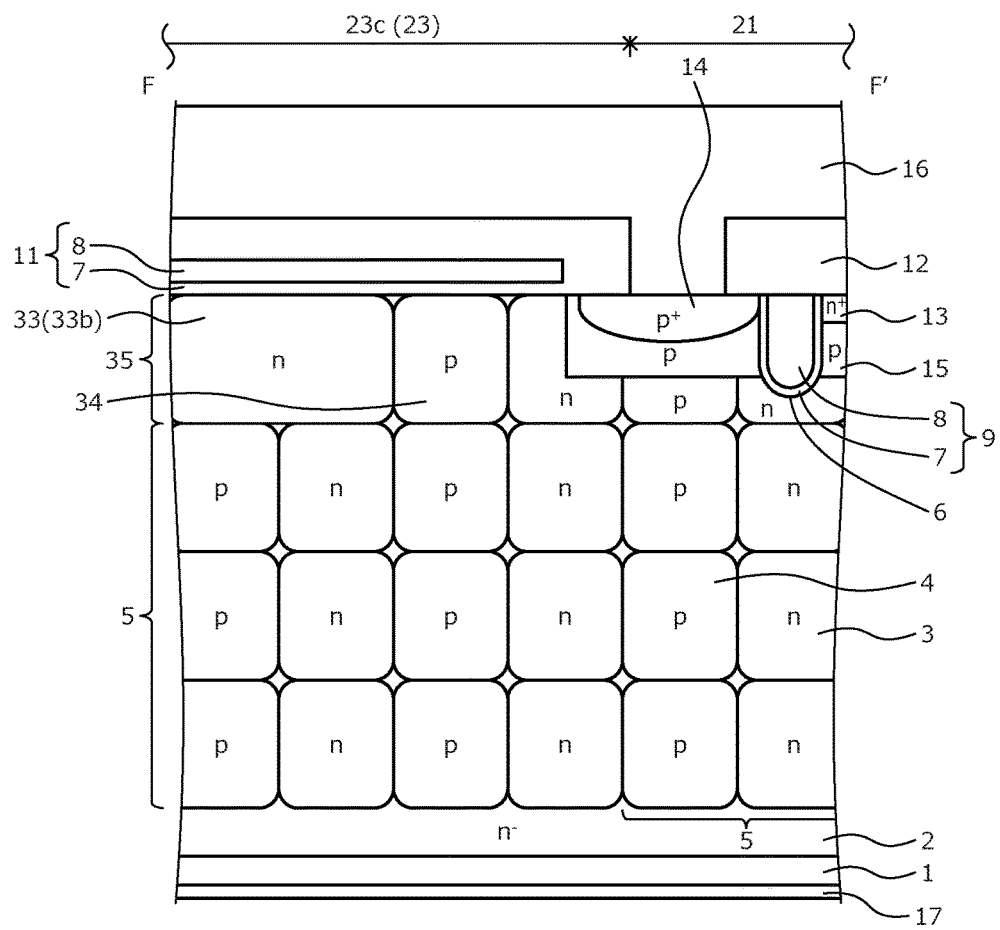
FIG. 11 is a cross-sectional view at a cutting line F-F' in FIG. 9.

Further, in the second region 23b of the intermediate region 23, the planar layout of the n-type region and the p-type region of the parallel pn layer may be variously modified. Another example of the planar layout of the parallel pn layer in the surface region on the base front surface of the intermediate region 23 is depicted in FIG. 9. FIG. 9 is a plan view of another example of the planar layout of the parallel pn layers in the surface region on the base front surface of the semiconductor device according to the second embodiment. FIG. 10 is a cross-sectional view at a cutting line E-E' in FIG. 9. FIG. 11 is a cross-sectional view at a cutting line F-F' in FIG. 9.

As depicted in FIG. 9, the parallel pn layer of the first portion 23c of the second region 23b of the intermediate region 23 may be provided as the n-type region 33 and the p-type region 34 of the second parallel pn layer 35 extending along the second direction X from the second portion 23d of the second region 23b of the intermediate region 23. In this case, the n-type region 33 and the p-type region 34 of the second parallel pn layer 35 in the first portion 23c of the second region 23b of the intermediate region 23 may be preferably arranged in a planar layout capable of maintaining the charge balance of the n-type region 3 and the p-type region 4 of the first parallel pn layer 5 at the boundary with the active region 21.

In particular, the planar layout of the second parallel pn layer 35 is determined so that the n-type region 33 that has a conductivity type different from that of a p-type region 4a of the first parallel pn layer 5 arranged in the active region 21 and that is farthest on the second region 23b side of the intermediate region 23 is arranged adjacent to, for example, the p-type region 4a. In other words, the planar layout of the second parallel pn layer 35 is set so that near the boundary of the second region 23b of the intermediate region 23 and the active region 21, total impurity amounts of the n-type regions 3, 33 and the p-type regions 4, 34 of the first and second parallel pn layers 5, 35 become roughly the same. In addition, in the intermediate region 23, an area ratio of the n-type region 33 and the p-type region 34 of the second parallel pn layer 35 is set to be roughly the same.

More specifically, for example, the p-type region 34a of the second parallel pn layer 35 arranged in the second region 23b of the intermediate region 23 and farthest on the active region 21 side thereof extends along the second direction X from the second portion 23d and terminates in the first portion 23c. Although the p-type region 34a faces a portion of the p-type region 4a of the first parallel pn layer 5 in the first direction Y (FIG. 10), a length (length along the second direction X) x1 of the portion of the p-type region 34a facing the active region 21 in the first direction Y is set to be sufficiently short compared to a length x2 of a convex portion 33a (described hereinafter) of the n-type region 33, facing the active region 21 (x1<x2). The p-type region 34a of the second parallel pn layer 35 arranged in the second region 23b of the intermediate region 23 and farthest on the active region 21 side thereof may terminate on an extension of the boundary of the first region 23a of the intermediate region 23 and the active region 21.

In the second parallel pn layer 35 arranged in the second region 23b of the intermediate region 23, the n-type region 33 farthest on the active region 21 side is configured to have a curved planar layout of a convex shape on the active region 21 side in the first portion 23c. The convexly curved portion (hereinafter, convex portion) 33a of the n-type region 33 on the active region 21 side is adjacent to, for example, the p-type region 4 of the first parallel pn layer 5 in the active region 21, nearest the second region 23b of the intermediate region 23. A p-type region 34b in contact with and arranged farther away from the active region 21 than the n-type region 33 having the convex portion 33a is has a curved planar layout of a convex shape on the active region 21 side, along the convex portion 33a of the n-type region 33 on the active region 21 side.

In addition, the respective planar shapes of the other n-type regions 33 and p-type regions 34 of the second parallel pn layer 35 arranged in the second region 23b of the intermediate region 23 have a more linear shape extending along the second direction X, the farther away the respective n-type regions 33 and p-type regions 34 are from the n-type region 33 farthest on the active region 21. The second parallel pn layer 35 arranged in the second region 23b of the intermediate region 23, on a side away from the active region 21, has a width w11 that is wide at a portion 33b of a part of the n-type region 33 (or the p-type region 34) (FIG. 11). Therefore, a length x3 of the portion 33b of the n-type region 33 is set so that relative to the impurity amount of the p-type region 34 adjacent to the portion 33b, increases of the impurity amount of this n-type region 33 at the portion 33b that is wide and has the width w11 is suppressed.

By configuring the planar layout of the second parallel pn layer 35 as depicted in FIG. 9, as described above, the n-type region 33 of the second parallel pn layer 35 contacts the p-type region 4a of the first parallel pn layer 5, nearest the second region 23b of the intermediate region 23. Therefore, the charge balance of the impurity concentrations of the n-type region and the p-type region of the parallel pn layer may be maintained near the boundary of the active region 21 and the intermediate region 23. Further, the n-type region 33 and the p-type region 34 of the second parallel pn layer 35 at a portion on the edge termination region 22 side of the intermediate region 23 have a linear planar shape, extending along the second direction X. Therefore, the charge balance of the impurity concentrations of the n-type region and the p-type region of the parallel pn layer may be maintained at the edge termination region 22.

As described, according to the second embodiment, even when the planar layout of the second parallel pn layer at the second region of the intermediate region is changed, effects identical to those of the first embodiment may be obtained.

Figure 12:
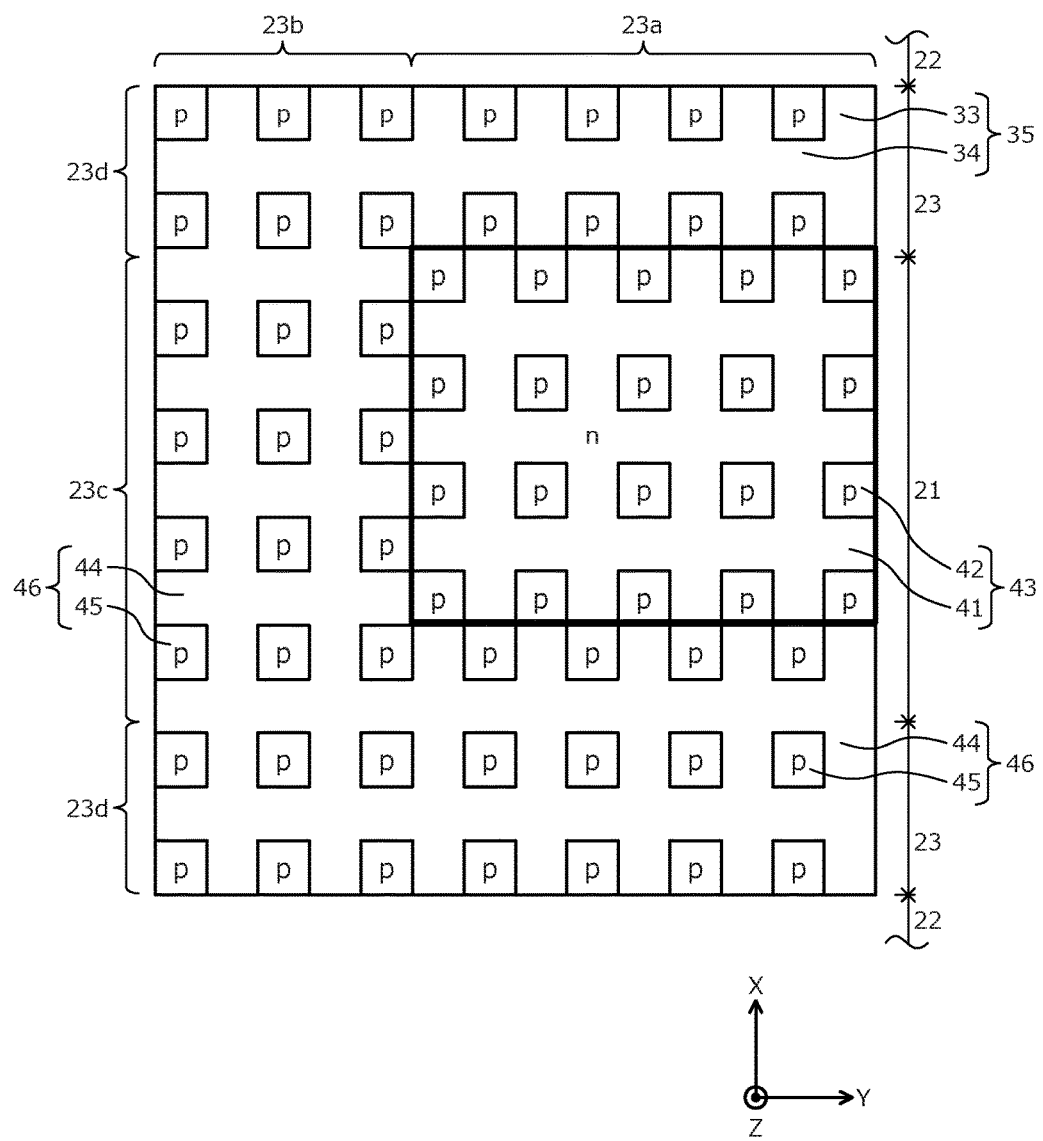
FIG. 12 is a plan view of a planar layout of the parallel pn layers in a surface region of the base front surface of the semiconductor device according to a third embodiment.
Figure 13:
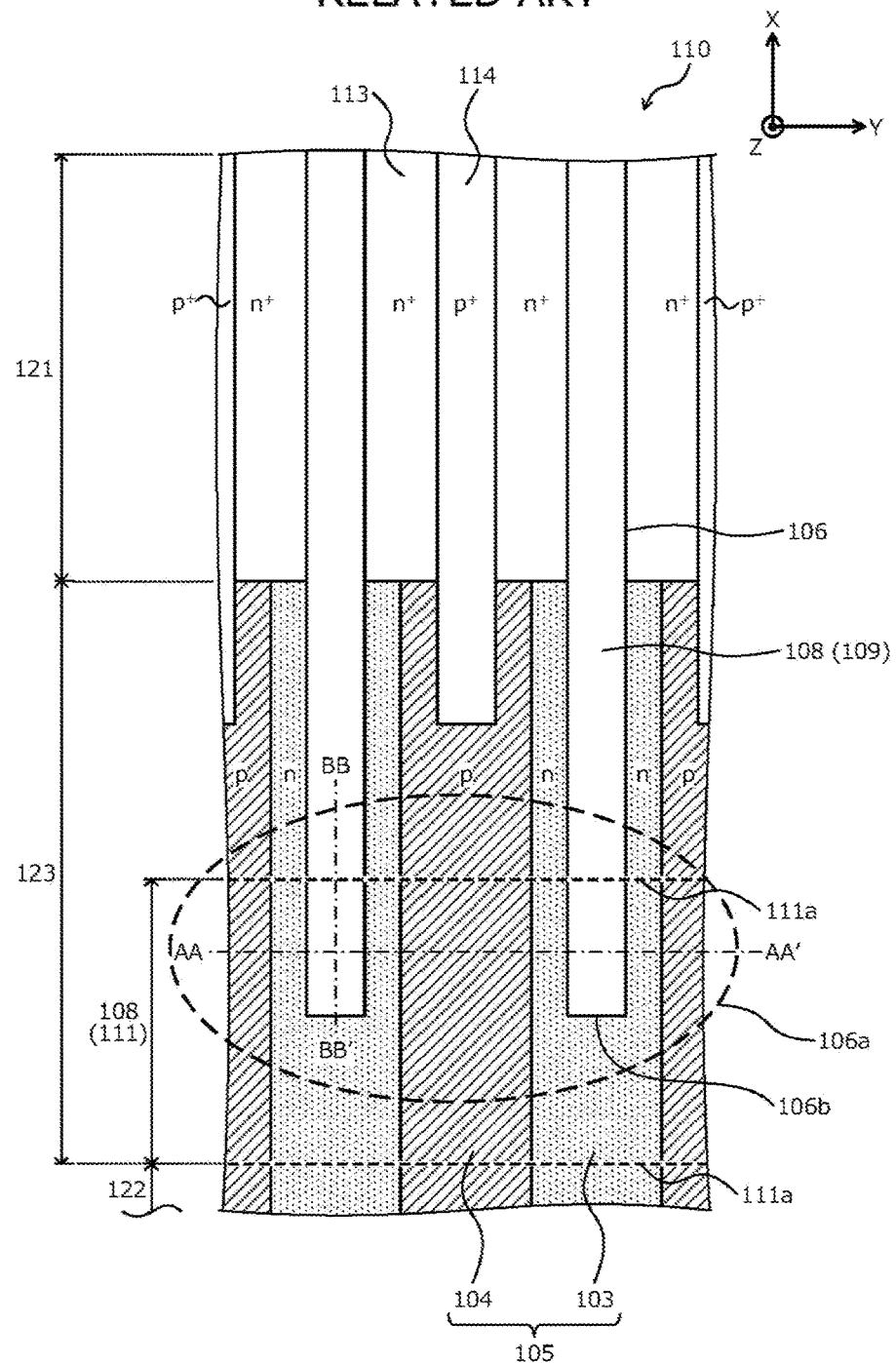
FIG. 13 is a plan view of a planar layout of a portion of a MOS gate of a trench-gate-type SJ-MOSFET of a related art.
Figure 14:
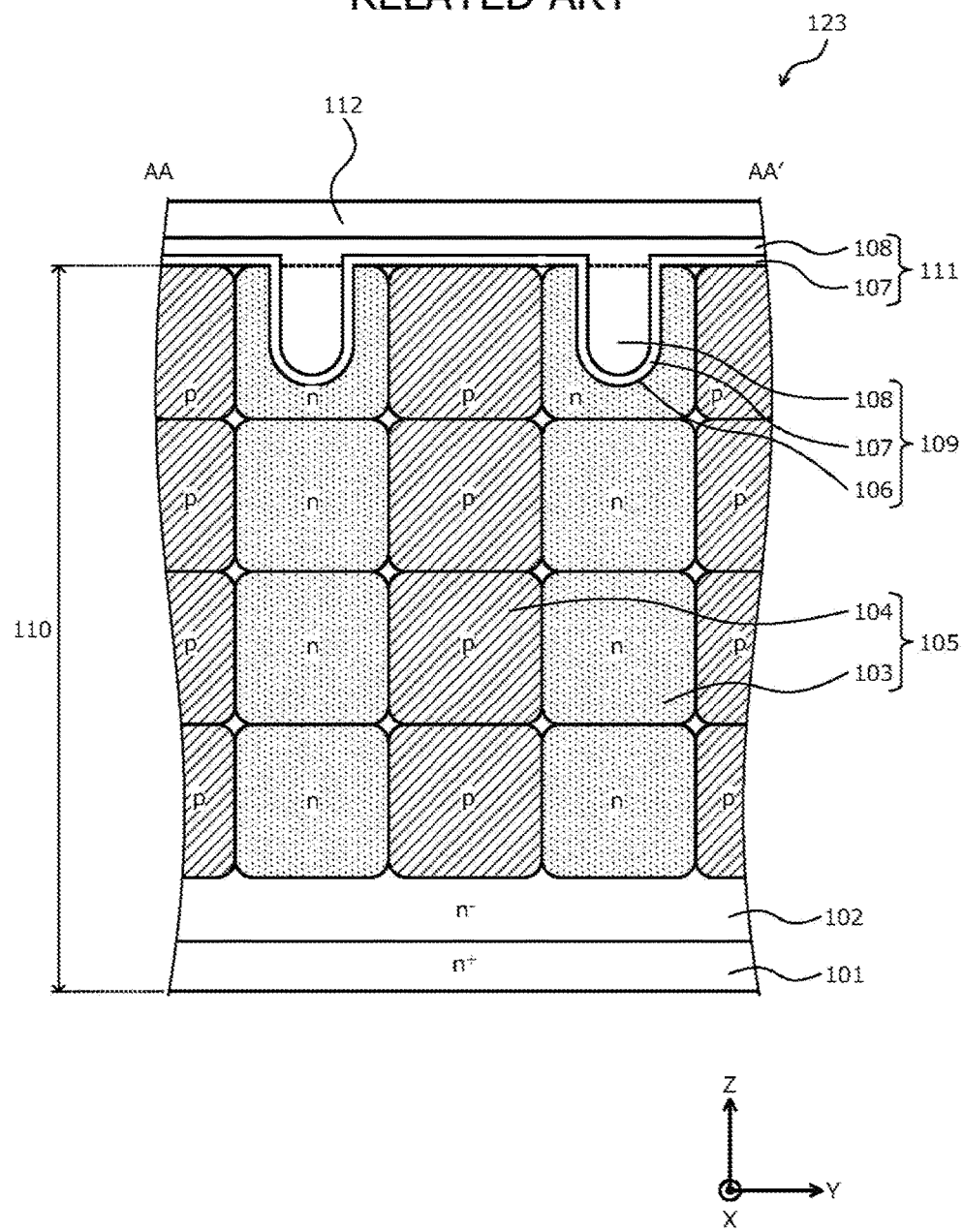
FIG. 14 is a cross-sectional view along a cutting line AA-AA' in FIG. 13.

A structure of the semiconductor device according to a third embodiment will be described. FIG. 12 is a plan view of a planar layout of the parallel pn layers in a surface region of the base front surface of the semiconductor device according to the third embodiment. The semiconductor device according to the third embodiment differs from the semiconductor device according to the second embodiment in that p-type regions 42, 45 of first and second parallel pn layers 43, 46 of the active region 21 and the intermediate region 23 are arranged in a matrix planar layout.

In particular, in the active region 21, the p-type regions 42 of the first parallel pn layer 43 are arranged in a matrix planar layout so as to face each other in the depth direction Z between adjacent gate trenches 6. The planar shape of the p-type region 42 of the first parallel pn layer 43, for example, may be a substantially rectangular shape or a substantially hexagonal shape. At a portion facing the gate trench 6 in the depth direction Z, an n-type region 41 of the first parallel pn layer 43 is arranged and the p-type region 42 of the first parallel pn layer 43 does not face the gate trench 6 in the depth direction Z. Further, the n-type region 41 of the first parallel pn layer 43 is arranged in a lattice planar layout surrounding a perimeter of the p-type regions 42.

In the first region 23a of the intermediate region 23, the p-type regions 45 of the second parallel pn layer 46 are arranged in a matrix planar layout. Further, the p-type regions 45 of the second parallel pn layer 46 face the n-type region 41 of the first parallel pn layer 43 along the second direction X at the boundary of the first region 23a of the intermediate region 23 and the active region 21. The p-type region 45 of the second parallel pn layer 46 covers the end-portion side wall 6b of the gate trench 6 at the gate trench termination portion 6a (refer to FIG. 6). In other words, the gate trench termination portion 6a (refer to FIG. 6) terminates in the p-type region 45 of the second parallel pn layer 46. The planar shape of the p-type regions 45 of the second parallel pn layer 46 may be, for example, substantially rectangular or substantially hexagonal.

An n-type region 44 of the second parallel pn layer 46 is arranged in a lattice planar layout surrounding a perimeter of the p-type regions 45. In the second region 23b of the intermediate region 23, in a surface region on the base front surface side, the second parallel pn layer 46 continuous from the first region 23a is arranged. Although not depicted, at a portion farther on the drain side than the second parallel pn layer 46 is, the n-type region 41 and the p-type region 42 of the first parallel pn layer 43 continuous from the active region 21 are arranged. Further, the gate trench termination portion 6a terminates in the p-type region 45 of the second parallel pn layer 46 and the planar layout of the first parallel pn layer 43 of the active region 21 may be a striped shape similar to the first and second embodiments.

As described above, according to the third embodiment, even when the p-type regions of the parallel pn layer are arranged in a matrix planar layout, if the gate trench termination portion terminates in the p-type region of the second parallel pn layer, effects identical to those of the first and second embodiments may be obtained.

Further, in the first to third embodiments described, although the edge termination region 22 is not depicted, the planar layout of the parallel pn layer of the edge termination region 22 may be variously modified and may differ from that of the first and second parallel pn layers 5, 35 of the active region 21 and the intermediate region 23. For example, in the edge termination region 22, the n-type region and the p-type region may be arranged in the same planar layout as that of the first parallel pn layer 5 of the active region 21. Further, in the edge termination region 22, the n-type region and the p-type region may be arranged in a striped planar layout extending along a direction (the first direction Y) orthogonal to the first parallel pn layer 5 of the active region 21 in a plan view.

Further, in the edge termination region 22, in a surface region on the base front surface side of the parallel pn layer, the n-type region 33 and the p-type region 34 of the second parallel pn layer 35 (or the n-type region 44 and the p-type region 45 of the second parallel pn layer 46) may be arranged, continuous from the intermediate region 23. The repetition pitch of the n-type region and the p-type region of the parallel pn layer of the edge termination region 22 may be changed variously and may differ from that of the first and second parallel pn layers 5, 35 of the active region 21 and the intermediate region 23. Further, the planar layouts of the parallel pn layers may differ between the edge termination region 22 and, the active region 21 and the intermediate region 23.

The present invention is not limited to the described embodiments and various modifications are possible within a scope not deviating from the spirit of the invention. For example, it is sufficient that the gate trench termination portion terminates in the p-type region of the second parallel pn layer. Further, the arrangement site of the second parallel pn layer is not limited to the intermediate region and may be various changed according to the termination position of the gate trench. The present invention is further applicable to a trench-gate-type insulated gate bipolar transistor (IGBT). The present invention is similarly implemented when the conductivity types (n-type, p-type) are reversed.

In the embodiments above, although a case in which an n⁻-type buffer layer having an impurity concentration lower than that of the n-type region of the first parallel pn layer has been described as an example, configuration may be such that the n⁻-type buffer layer is not provided, or in place pf the n⁻-type buffer layer, an n-type buffer layer having an impurity concentration substantially the same as that of the n-type region of the first parallel pn layer may be provided. Further, although an example in which the present invention is applied in a case of silicon (Si), the present invention is further applicable in cases of wide bandgap semiconductors such as silicon carbide (SiC), gallium nitride (GaN), etc. A wide bandgap semiconductor is a semiconductor having a bandgap that is wider than that of silicon.

Figure 15:
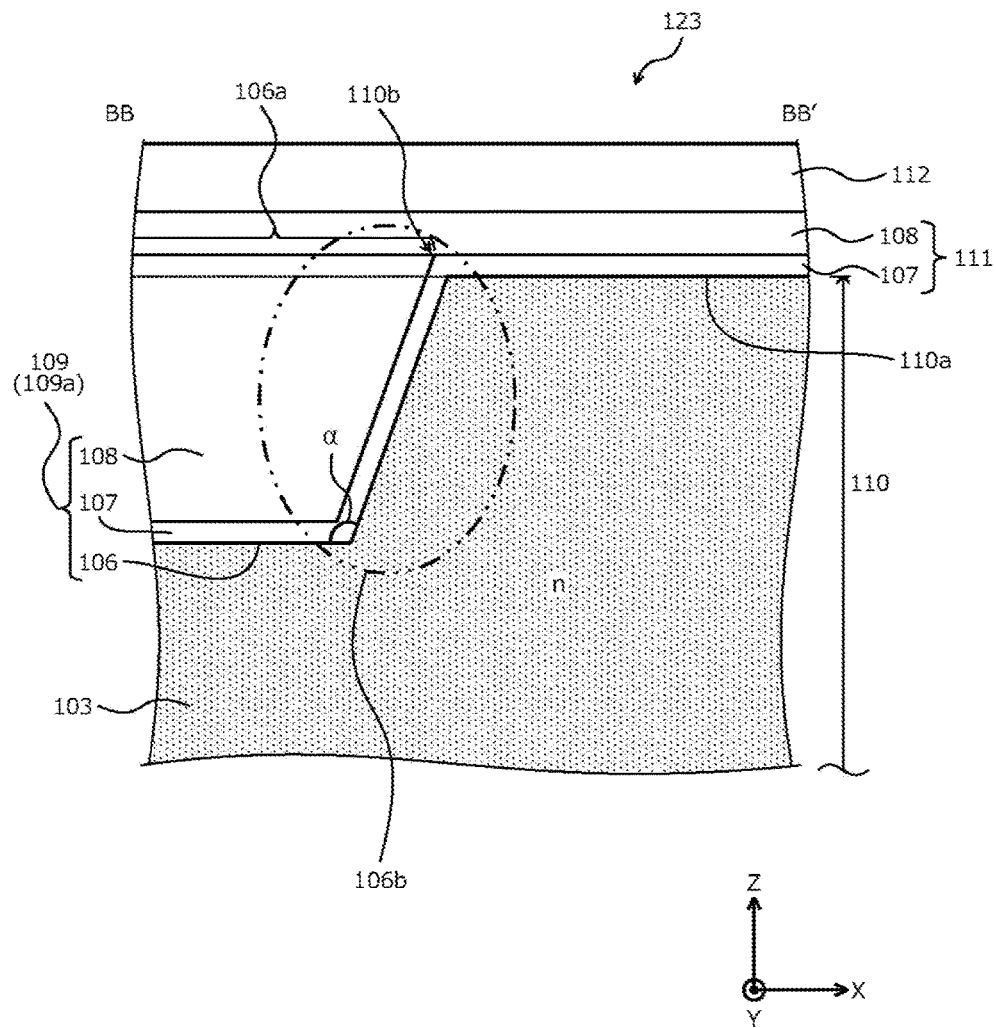
FIG. 15 is a cross-sectional view along a cutting line BB-BB' in FIG. 13.

Nonetheless, as described above, conventionally, when the MOS gate is structured to extend from inside the gate trench 106, onto to the front surface 110a of the semiconductor base 110, the gate trench termination portion 106a does not reach the chip end portion. At the gate trench termination portion 106a, as a result of differences in etching speed consequent to the crystal plane of silicon (Si), etc., a side wall (hereinafter, end portion side wall) 106b of the gate trench 106, substantially parallel to a direction (hereinafter, a first direction) Y orthogonal to the second direction X has, with respect to the bottom surface, an incline angle α that is greater than that of other side walls (refer to FIG. 15).

As a result, at a boundary of the front surface 110a of the semiconductor base 110 and the end portion side wall 106b of the gate trench 106, a pointed portion 110b is generated at a silicon portion (the semiconductor base 110) and various crystal plane orientations are exposed at the end portion side wall 106b of the gate trench 106. Therefore, electric field easily concentrates near the end portion side wall 106b of the gate trench 106, arising in a problem in that gate breakdown voltage decreases at the gate trench termination portion 106a. The gate breakdown voltage is the gate voltage limit at which element destruction does not occur (i.e., the maximum gate voltage that may be applied to the gate electrode 108).

This problem may be avoided by providing in an ordinary trench gate MOSFET not having a superjunction structure, a p-type well region so as to completely cover the gate trench termination portion. Nonetheless, in a trench-gate-type SJ-MOSFET, when a p-type well region is provided so as to completely cover the gate trench termination portion 106a, the charge balance of the impurity concentration of the n-type region 103 and the p-type region 104 of the parallel pn layer 105 is lost, causing reductions in the breakdown voltage. Therefore, a configuration in which a p-type well region is provided to completely cover the gate trench termination portion 106a is not applicable to a trench-gate-type SJ-MOSFET.

According to the present invention described above, the second parallel pn layer is arranged at a surface region on the first main surface side of the first parallel pn layer and a trench terminal portion is covered by the second second-conductivity-type semiconductor region of the second parallel pn layer whereby the charge balance of the impurity concentration of the first first-conductivity-type semiconductor region and the first second-conductivity-type semiconductor region of the first parallel pn layer may be maintained while the electric field applied to the trench terminal portion is mitigated.

According to the semiconductor device and the method of manufacturing a semiconductor device of the present invention, an effect is achieved in that a semiconductor device may be provided for which the breakdown voltage is enhanced and for which the reliability of the gate insulating film is high.

As described, the semiconductor device and the method of manufacturing a semiconductor device according to the present invention, are useful for superjunction semiconductor devices having a trench gate structure and are particularly suitable for automotive trench-gate-type SJ-MOSFETs.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A semiconductor device having an active region, comprising:
a first parallel pn layer having a first main surface and a second main surface, the first parallel pn layer having a plurality of first pairs of semiconductor regions, each first pair including a first first-conductivity-type semiconductor region and a first second-conductivity-type semiconductor region, the first first-conductivity-type semiconductor regions and the first second-conductivity-type semiconductor regions of said first pairs being alternately and repeatedly arranged with a repetition pitch in a first direction in a first plane parallel to the first main surface;
a first semiconductor portion of a second conductivity type arranged on the first main surface of the first parallel pn layer;
a second parallel pn layer, adjacent to the first semiconductor portion on the first main surface of the first parallel pn layer, and having a plurality of second pairs of semiconductor regions, each second pair including a second first-conductivity-type semiconductor region and a second second-conductivity-type semiconductor region, the second first-conductivity-type semiconductor regions and the second second-conductivity-type semiconductor regions of said second pairs being alternately and repeatedly arranged with the repetition pitch in the first direction in a second plane parallel to the first main surface, a position of each second pair of semiconductor regions being shifted in the first direction by half of the repetition pitch with respect to a position of each first pair of semiconductor regions;
at least one trench reaching a surface layer of a first first-conductivity-type semiconductor region of one of the first pairs of semiconductor regions from a surface of the first semiconductor portion, the at least one trench extending to the second parallel pn layer and terminating in a second second-conductivity-type semiconductor region of one of the second pairs of semiconductor regions;
a second semiconductor portion of a first conductivity type selectively formed in a surface layer of the first semiconductor portion, in contact with the at least one trench;
a gate insulating film, and a gate electrode on the gate insulating film, provided in the at least one trench, the gate electrode extending from inside to outside the at least one trench and being arranged over a surface of the second parallel pn layer with the gate insulating film therebetween;
a first electrode electrically connected to the first and second semiconductor portions;
a semiconductor layer provided on the second main surface of the first parallel pn layer; and
a second electrode electrically connected to the semiconductor layer.
2. The semiconductor device according to claim 1, wherein
the at least one trench has a short width in one direction and a long width in another direction orthogonal to the one direction, the short width in the one direction being less than a width of the second second-conductivity-type semiconductor region in said one of the second pairs of semiconductor regions in the plan view.

3. The semiconductor device according to claim 2, wherein
a depth of the at least one trench from the surface of the first semiconductor portion in a direction toward the second main surface is greater than a thickness of the second second-conductivity-type semiconductor regions in the second pairs of semiconductor regions.

4. The semiconductor device according to claim 1, wherein
the first first-conductivity-type semiconductor regions and the first second-conductivity-type semiconductor regions in the first pairs of semiconductor regions are arranged in a striped layout in the first plane, extending in a second direction orthogonal to the first direction.

5. The semiconductor device according to claim 1, wherein
the first second-conductivity-type semiconductor regions of the first pairs of semiconductor regions are arranged in a matrix layout in the first plane, and
the first first-conductivity-type semiconductor regions of the first pairs semiconductor are arranged in a lattice shape so as to surround a perimeter of each of the first second-conductivity-type semiconductor regions of said first pairs.

6. The semiconductor device according to claim 4, wherein
the second first-conductivity-type semiconductor regions and second second-conductivity-type semiconductor regions in the second pairs of semiconductor regions are arranged in a striped layout in the second plane, extending in the second direction.

7. The semiconductor device according to claim 5, wherein
the second first-conductivity-type semiconductor regions and second second-conductivity-type semiconductor regions in the second pairs of semiconductor regions are arranged in a striped layout in the second plane, extending in a second direction orthogonal to the first direction.

8. The semiconductor device according to claim 4, wherein
the second second-conductivity-type semiconductor regions in the second semiconductor regions are arranged in a matrix layout in the second plane, and
the second first-conductivity-type semiconductor regions in the second pairs of semiconductor regions are arranged in a lattice shape so as to surround a perimeter of each of the second second-conductivity-type semiconductor regions of said second pairs.

9. The semiconductor device according to claim 4, wherein
the at least one trench includes a plurality of trenches that are arranged in a striped layout in the first plane, extending in the second direction.

10. The semiconductor device according to claim 1, wherein
the first parallel pn layer extends from inside to outside of the active region, and
the second parallel pn layer is disposed outside the active region.

11. The semiconductor device according to claim 1, further comprising
a groove reaching the first semiconductor portion from the second semiconductor portion, wherein
the first electrode contacts the first semiconductor portion and the second semiconductor portion, inside the groove.

12. The semiconductor device according to claim 1, further comprising
a high-impurity-concentration semiconductor region of the first conductivity type provided between the first electrode and the first semiconductor portion, the high-concentration semiconductor region having an impurity concentration higher than that of the first semiconductor portion, wherein
the first electrode is in contact with the high-concentration semiconductor region and the second semiconductor portion.

13. The semiconductor device according to claim 1, further comprising
a low-impurity-concentration semiconductor region of the first conductivity type provided between the semiconductor layer and the first first-conductivity-type semiconductor regions of the first pairs of semiconductor regions, the low-impurity-concentration semiconductor region having an impurity concentration lower than that of the first first-conductivity-type semiconductor regions of said first pairs.

* * * * *